(12) United States Patent
Lee et al.

(10) Patent No.: US 8,198,657 B2
(45) Date of Patent: Jun. 12, 2012

(54) THIN FILM TRANSISTOR ARRAY PANEL AND METHOD FOR MANUFACTURING THE SAME

(75) Inventors: Dong-Hoon Lee, Seoul (KR); Do-Hyun Kim, Seongnam-si (KR); Chang-Oh Jeong, Suwon-si (KR); O-Sung Seo, Seoul (KR); Xin-Xing Li, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 331 days.

(21) Appl. No.: 12/652,379

(22) Filed: Jan. 5, 2010

(65) Prior Publication Data

US 2011/0068340 A1  Mar. 24, 2011

(30) Foreign Application Priority Data

Sep. 21, 2009 (KR) .................. 10-2009-0088848

(51) Int. Cl.
*H01L 23/52* (2006.01)
*H01L 21/82* (2006.01)

(52) U.S. Cl. . 257/208; 257/288; 257/368; 257/E29.151; 257/E29.273; 257/E51.005; 257/E21.533; 257/E21.535; 438/129; 438/149

(58) Field of Classification Search .................. None
See application file for complete search history.

(56) References Cited

U.S. PATENT DOCUMENTS

| 6,399,428 | B2 |   | 6/2002 | Nakahori et al. |           |
|-----------|----|---|--------|-----------------|-----------|
| 7,371,621 | B2 | * | 5/2008 | Kim et al.      | 438/149   |
| 7,919,795 | B2 | * | 4/2011 | Lee et al.      | 257/288   |
| 2004/0232443 | A1 | * | 11/2004 | Cho et al.    | 257/202   |
| 2005/0242401 | A1 | * | 11/2005 | Cho et al.    | 257/368   |
| 2006/0024866 | A1 |   | 2/2006  | Gan et al.    |           |
| 2006/0186414 | A1 | * | 8/2006  | Hwang et al.  | 257/72    |
| 2008/0067603 | A1 | * | 3/2008  | Choung et al. | 257/365   |
| 2009/0311814 | A1 | * | 12/2009 | You           | 438/29    |

FOREIGN PATENT DOCUMENTS

| JP | 2000-284326 | 10/2000 |
| JP | 2001-332740 | 11/2001 |
| JP | 2002-094069 | 3/2002 |
| JP | 2002-111004 | 4/2002 |
| JP | 2007-250804 | 9/2007 |
| JP | 2009-070881 | 4/2009 |

(Continued)

OTHER PUBLICATIONS

English Abstract for Publication No. 2000-284326, Oct. 13, 2003.

(Continued)

*Primary Examiner* — Alonzo Chambliss
(74) *Attorney, Agent, or Firm* — F. Chau & Associates, LLC

(57) ABSTRACT

A thin film transistor array panel includes an insulating substrate. A gate line is formed on the insulating substrate and has a gate electrode. A gate insulating layer is formed on the gate line. A semiconductor layer is formed on the gate insulating layer and overlaps the gate electrode. Diffusion barriers are formed on the semiconductor layer and contain nitrogen. A data line crosses the gate line and has a source electrode partially contacting the diffusion barriers and a drain electrode partially contacting the diffusion barriers and facing the source electrode. The drain electrode is on the gate electrode. A pixel electrode is electrically connected to the drain electrode.

20 Claims, 24 Drawing Sheets

FOREIGN PATENT DOCUMENTS

| | | |
|---|---|---|
| JP | 2009-070956 | 4/2009 |
| KR | 1020010003759 | 1/2001 |
| KR | 10-0328847 | 3/2002 |
| KR | 1020080044581 | 5/2008 |
| KR | 10-0848557 | 7/2008 |
| KR | 1020080093709 | 10/2008 |

OTHER PUBLICATIONS

English Abstract for Publication No. 1020010003759, Jan. 15, 2001.
English Abstract for Publication No. 2001-332740, Nov. 30, 2001.
English Abstract for Publication No. 10-0328847, Mar. 5, 2002.
English Abstract for Publication No. 2002-094069, Mar. 29, 2002.
English Abstract for Publication No. 2002-111004, Apr. 12, 2002.
English Abstract for Publication No. 2007-250804, Sep. 27, 2007.
English Abstract for Publication No. 1020080044581, May 21, 2008.
English Abstract for Publication No. 10-0848557, Jul. 21, 2008.
English Abstract for Publication No. 1020080093709, Oct. 22, 2008.
English Abstract for Publication No. 2009-070881, Apr. 2, 2009.
English Abstract for Publication No. 2009-070956, Apr. 2, 2009.

* cited by examiner

THIN FILM TRANSISTOR ARRAY PANEL AND METHOD FOR MANUFACTURING THE SAME

CROSS REFERENCE TO RELATED APPLICATIONS

This application claims priority to Korean Patent Application No. 10-2009-0088848, filed Sep. 21, 2009, the contents of which are herein incorporated by reference in its entirety.

BACKGROUND OF THE INVENTION (a) Technical Field

The present description relates to a thin film transistor (TFT), and more particularly, to a TFT array panel and a manufacturing method of the same.

(b) Discussion of the Related Art

Liquid crystal displays (LCDs) are one of the most widely used flat panel displays. An LCD includes a liquid crystal (LC) layer interposed between two panels provided with field-generating electrodes. The LCD displays images by applying voltages to the field-generating electrodes to generate an electric field in the LC layer, which determines orientations of LC molecules in the LC layer to adjust polarization of incident light.

Commonly, LCDs include two panels respectively provided with field-generating electrodes, wherein one panel has a plurality of pixel electrodes in a matrix and the other has a common electrode covering the surface of the panel.

The LCD can display images by applying a different voltage to each pixel electrode. For this purpose, thin film transistors (TFTs), having three terminals to switch voltages applied to pixel electrodes, are connected to the pixel electrodes and gate lines. This configuration allows for the transmission of signals for controlling thin film transistors and allows for the data lines to transmit voltages applied to pixel electrodes formed on a thin film transistor (TFT) array panel.

The gate lines and data lines of the TFT array panel may include a conductive material having low resistivity such as, for example, aluminum (Al), an Al alloy, copper (Cu), a Cu alloy, silver (Ag) or a Ag alloy to reduce signal delay. However, the above low resistivity materials may have weak chemical or physical properties when they are used in a transistor so that the transistor may be ruined or an "on" current of the TFTs may be decreased, thereby degrading the image quality of an LCD.

SUMMARY

Exemplary embodiments of the present invention may provide a TFT array panel having enhanced image quality of a display.

Exemplary embodiments of the present invention provide a thin film transistor array panel including an insulating substrate, a gate line formed on the insulating substrate and including a gate electrode, a gate insulating layer formed on the gate line, a semiconductor layer formed on the gate insulating layer and overlapping the gate electrode, a first ohmic contact layer formed on the semiconductor layer, a diffusion barrier layer containing nitrogen formed on the first ohmic contact layer, a second ohmic contact layer formed on the diffusion barrier layer, a data line crossing the gate line and including a source electrode and a drain electrode on the diffusion barrier layer, a passivation layer on the data line and a pixel electrode formed on the passivation layer and electrically connected to the drain electrode.

The semiconductor layer may have substantially the same planar pattern as the data line except a portion between the source and drain electrodes. The gate line may include copper or a copper alloy. Red, green, and blue color filters may be under the pixel electrode on the substrate. The data line may include a Cu—Mn (copper-manganese) alloy. A surface of the data line may include a Mn oxide.

Exemplary embodiments of the present invention provide a method for manufacturing a thin film transistor array panel including forming a gate line having a gate electrode on an insulating substrate. A gate insulating layer and an a-Si layer are formed. A first ohmic contact layer doped with a conductive impurity is formed. A diffusion barrier layer and a second ohmic contact layer are formed. A data line, source and drain electrodes overlapping with the second ohmic contact layer are formed. A passivation layer is formed on the data line and a pixel electrode electrically connected to the drain electrode is formed.

In the above method, the data line may include a Cu—Mn alloy and the diffusion barrier layer may include the same material as the first ohmic contact layer and nitrogen. The diffusion barrier layer may be formed through the plasma treatment. The semiconductor layer, the first ohmic contact layer, the diffusion barrier layer, the second ohmic contact layer and the data line having the source and drain electrode may be formed through a single photo exposure process.

BRIEF DESCRIPTION OF THE DRAWINGS

FIG. 7 is a layout view of a TFT array panel for an LCD according to an exemplary embodiment of the present invention;

DETAILED DESCRIPTION OF EXEMPLARY EMBODIMENTS

Figure 1:
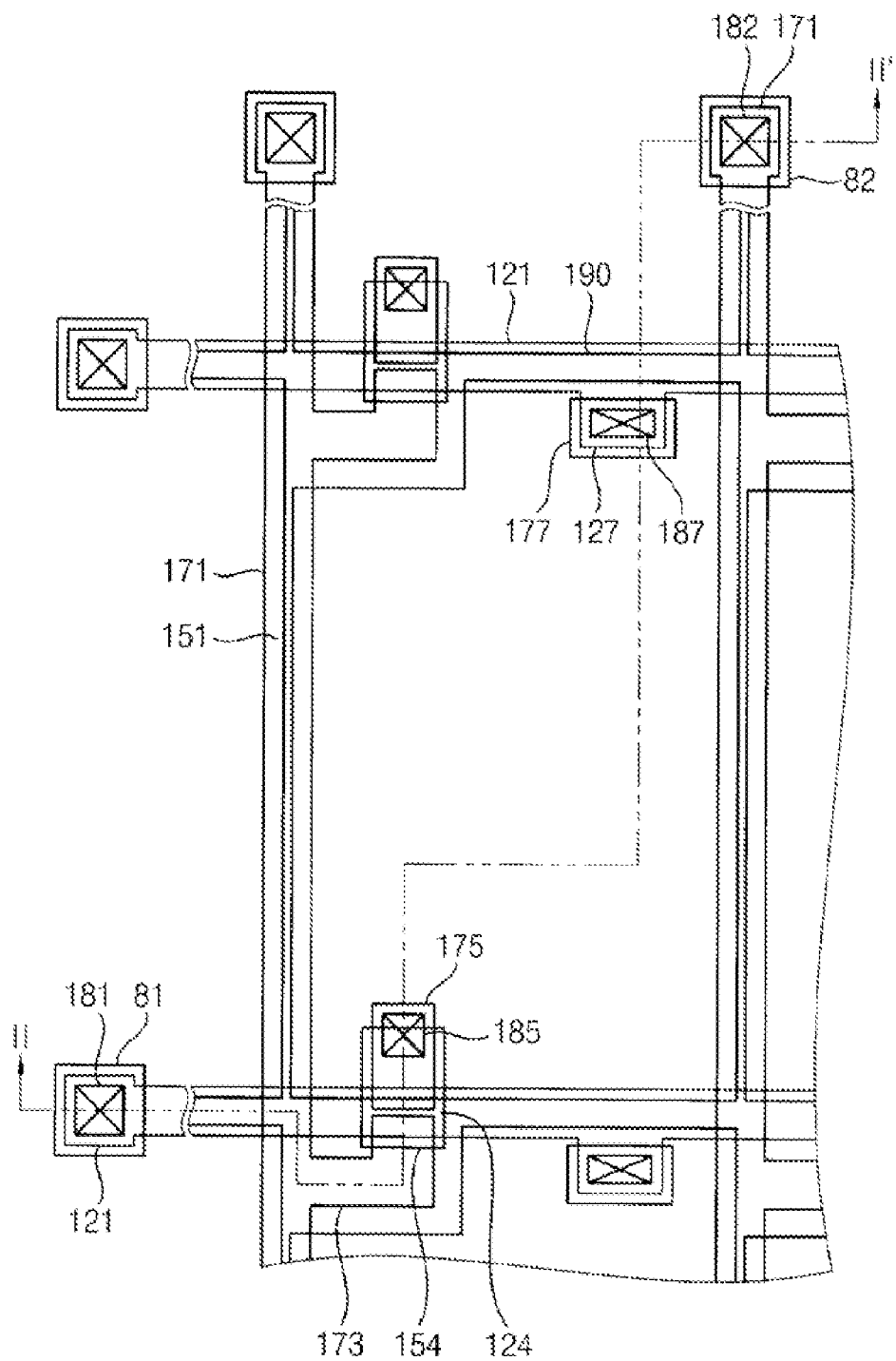
FIG. 1 is a layout view of a TFT array panel for an LCD according to an exemplary embodiment of the present invention.

Exemplary embodiments of the present invention will be described more fully hereinafter with reference to the accompanying drawings, in which exemplary embodiments of the invention are shown. The present invention may, however, be embodied in different forms and should not be construed as being limited to the embodiments set forth herein.

In the drawings, the thickness of layers, films, and regions may be exaggerated for clarity. Like numerals may refer to like elements throughout. It will be understood that when an element such as a layer, film, region, or substrate is referred to as being "on" another element, it can be directly on the other element or intervening elements may also be present.

A TFT array panel for an LCD according to an embodiment of the present invention will be described in detail below with reference to FIGS. 1 and 2.

Figure 2:
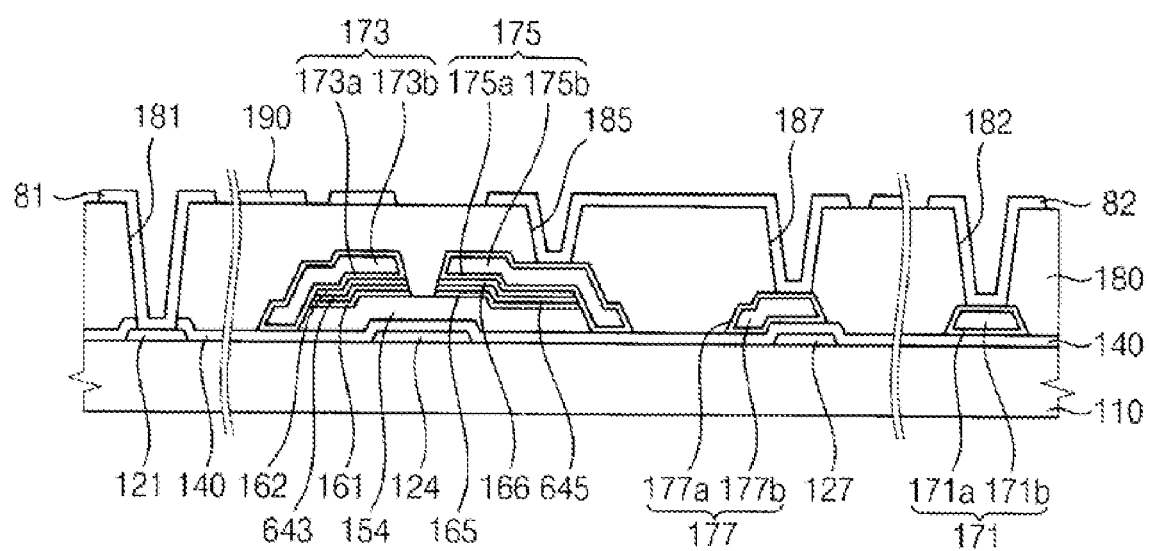
FIG. 2 is a cross sectional view of the TFT array panel shown in FIG. 1 taken along the line II-II'.

FIG. 1 is a layout view of a TFT array panel for an LCD according to an exemplary embodiment of the present invention and FIG. 2 is a cross sectional view of the TFT array panel shown in FIG. 1 taken along the line II-II'.

Referring to FIG. 1, a TFT array panel for an LCD includes a plurality of gate lines 121 for transmitting gate signals. The gate lines 121 are primarily formed in the horizontal direction. Portions of the gate lines 121 form a plurality of gate electrodes 124. Different portions of the gate lines 121, which extend in the lower direction toward a pixel electrode 190, form a plurality of expansions 127.

Data lines 171 for transmitting data voltages extend substantially in the longitudinal direction and intersect the gate lines 121 in a matrix arrangement. A plurality of branches of each data line 171, which projects toward the drain electrodes 175, forms a plurality of source electrodes 173. A pair of the source electrode 173 and the drain electrode 175 is separated from each other and overlaps with a gate electrode 124. A gate electrode 124, a source electrode 173, and a drain electrode 175, along with a semiconductor layer 154, form a TFT having a channel in the semiconductor layer 154 disposed between the source electrode 173 and the drain electrode 175. A storage capacitor conductor 177 overlaps with the expansion 127 of the gate line 121.

A pixel electrode 190 receiving a voltage from the TFT is connected to the drain electrode 175 of the TFT through a contact hole 185.

A storage capacitor conductor 177 which is connected through a contact hole 187 forms a storage capacitor with the expansion 127 of the gate line and preserves the received voltage after the TFT is turned off. The storage capacitor conductor 177 may be formed with the same material as the data line 171 and may overlap with expansion 127 of the gate line.

In some exemplary embodiments of the present invention, the pixel electrode 190 may overlap the adjacent gate line 121 and the adjacent data line 171 to increase the aperture ratio when a passivation layer 180 (FIG. 2) is made from an organic material.

Referring to FIG. 2, a gate line 121 for transmitting gate signal and a gate electrode 124 are formed on an insulating substrate 110.

The gate line 121 may comprise a conductive metal such as, for example, Al, an Al alloy, Cu, a Cu alloy, Ag, an Ag alloy, Au and an Au alloy. A gate line 121 may include a multi-layered film structure that may comprise a material such as Cr, Mo, Ta, Ti, and/or alloys thereof which have good physical, chemical, and electrical contact characteristics with other materials such as indium tin oxide (ITO) and indium zinc oxide (IZO). Examples of suitable combinations of the multi-layered film structure include a Mo/Al—Nd alloy, Al—Nd alloy/Mo, Al/Ti, Ti/Cu and/or Mo/Cu.

A gate insulating layer 140 comprising silicon nitride (SiNx) is formed on the gate line 121.

A semiconductor layer 154 comprising hydrogenated amorphous silicon (abbreviated as "a-Si") is formed on the gate insulating layer 140. The semiconductor layer 154 overlaps with the gate electrodes 124.

First ohmic contact layers 161 and 165 comprising silicide or hydrogenated a-Si heavily doped with an impurity are formed on the semiconductor layer 154. The first ohmic contact layers 161 and 165 are located in pairs on the semiconductor layer 154. For example, the first ohmic contact layers 161 and 165 may be an a-Si doped with an n+ type impurity.

Diffusion barrier layers 643 and 645 are formed on the first ohmic contact layers 161 and 165. The diffusion barrier layers 643 and 645 may include silicide and/or n+ hydrogenated a-Si and may further include nitrogen (N) or oxygen (O). Accordingly, the diffusion barrier layers 643 and 645 may have the same material as the first ohmic contact layers 161 and 165 and nitrogen (N) or may have the same material as the first ohmic contact layers 161 and 165 and oxygen (O). The diffusion barrier layers 643 and 645 have substantially the same planar pattern as the first ohmic contact layers 161 and 165.

The diffusion barrier layers 643 and 645 prevent a metal particle of the source electrode 173 and drain electrode 175 from diffusing into the semiconductor layer 154. The diffusion barrier layer 643 and 645 together with the ohmic contact layer may lower a contact resistance between the semiconductor layer and the source and drain electrode.

Second ohmic contact layers 162 and 166 are formed on the diffusion barrier layers 643 and 645. The second ohmic contact layers 162 and 166 may have the same composition as the first ohmic contact layers 161 and 165.

Edges of the semiconductor layer 154, the first ohmic contact layers 161 and 165, the diffusion barrier layers 643 and 645, and the second ohmic contact layers 162 and 166 may be tapered to increase adhesion with an upper layer.

A data line 171, a source electrode 173, a drain electrode 175, and a storage capacitor conductor 177 are formed on the second ohmic contact layers 643 and 645 and the gate insulating layer 140.

The source electrode 173 and the drain electrode 175 are separated and overlap with the gate electrode 124.

The gate electrode 124, the source electrode 173 and the drain electrode 175 make a TFT and a channel of the TFT is formed between the source electrode 173 and the drain electrode 175. The storage capacitor conductor 177 overlaps with the expansion 127 of the gate line 121.

The data line 171, a source electrode 173, a drain electrode 175, and a storage capacitor conductor 177 may comprise a copper-manganese alloy (Cu—Mn alloy), a main component of which is copper. The Cu—Mn alloy is deposited in a single layer, but after a heat, for example, an annealing process, Mn moves to a surface of the film so that the Cu—Mn alloy layer can have a stronger adhesion property and the resistivity of the Cu—Mn alloy layer is lowered. The Mn in the surface may prevent the copper from diffusing into the semiconductor layer and ohmic contact layer. The Mn in the surface may be an Mn oxide.

Center layers 171b, 173b, 175b and 177b of the data line 171, the source electrode 173, the drain electrode 175, and the storage capacitor conductor 177 mainly comprise copper and surface layers 171a, 173a, 175a and 177a may surround the center layers. The surface layers mainly comprise a manganese oxide layer.

The semiconductor layer 154 has an exposed portion between the source electrode and the drain electrode.

On the data line 171, the drain electrode 175 and the storage capacitor conductor 177, a passivation layer 180 is provided. The passivation layer 180 comprises an organic material having photosensitive properties or an inorganic material. The passivation layer 180 can be structured in a multiple layered way that comprising various combinations of the organic material and the inorganic material. To prevent the organic material of the passivation layer 180 from contacting the exposed portion of the semiconductor layer 154 between the source electrode 173 and the drain electrode 175, the passivation layer 180 can be structured such that an insulating layer comprising $SiN_x$ or $SiO_2$ is additionally formed under the organic material layer.

In the passivation layer 180, contact holes 185, 187, and 182 are formed and expose the drain electrode 175, the storage capacitor conductor 177, and an end portion of the data line 171, respectively. The end portion of the data line 171 may be wider than the other portions of the data line 171.

A pixel electrode 190 and contact assistants 81 and 82, which may comprise IZO or ITO, are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrode 175.

The contact assistants 81 and 82 are connected to the gate line 121 and the data line 171 through the contact holes 181 and 182. The contact assistants 81 and 82 supplement adhesion between the end portion of the data line 171 and the gate line 121 and external devices, such as the driving integrated circuit, and protects them. The contact assistants 81 and 82 are formed with the same material as the pixel electrode.

The pixel electrode 190, to which the data voltage is applied, generates an electric field with a common electrode (not illustrated) of the opposite substrate (not illustrated) to which a common voltage is applied, so that the liquid crystal molecules in the liquid crystal layer are rearranged.

A method of manufacturing a TFT array panel according to an exemplary embodiment of the present invention is described in detail below with reference to FIGS. 3A to 6B as well as FIGS. 1 and 2.

FIGS. 3A, 4A, 5A, and 6A are layout views sequentially illustrating the intermediate steps of a method of manufacturing a TFT array panel for an LCD according to an exemplary embodiment of the present invention. FIG. 3B is a cross sectional view of the TFT array panel shown in FIG. 3A taken along the line FIG. 4B is a cross sectional view of the TFT array panel shown in FIG. 4A taken along the line IVb-IVb' in a step following the step shown in FIG. 3B. FIG. 5B is a cross sectional view of the TFT array panel shown in FIG. 5A taken along the line Vb-Vb' in a step following the step shown in FIG. 4B. FIG. 6B is a sectional view of the TFT array panel shown in FIG. 6A taken along the line VIb-VIb' in a step following the step shown in FIG. 5B.

As shown in FIG. 3B, a metal layer is formed on an insulating substrate 110 using a method such as sputtering and is photo-etched (including photolithography and etching) to form gate line 121 having gate electrode 124.

A gate insulating layer 140, an a-Si layer 150, a first impurity silicon layer 160, impurity nitrogen silicon layer 600 and a second impurity silicon layer 160-1 are sequentially deposited on the gate line 121. The a-Si layer 150 comprises intrinsic amorphous silicon. The first and second impurity silicon layer 160 and 160-1 comprise extrinsic amorphous silicon which is doped with a conductive impurity ion. The impurity nitrogen silicon layer 600 comprises extrinsic amorphous silicon containing nitrogen.

The gate insulating layer 140 comprises silicon nitride with a thickness of about 2,000 Å to about 5,000 Å.

The four layers comprising silicon layers 150, 160, 600 and 160-1 may be deposited in a chamber by an in-situ method. After forming the a-Si layer 150, the first impurity layer 160 is formed by deposition while adding n-type impurities. Then, the impurity nitrogen silicon layer 600 is formed by introducing one or both of $NH_3$ and $N_2$ gas. And then, the second impurity layer 160-1 is formed by deposition while adding n-type impurities.

The impurity nitrogen silicon layer 600 can be formed by an ion implantation method or nitrogen plasma treatment after forming the first impurity silicon layer 160. The impurity nitrogen silicon layer 600 can have a thickness of between 10 Å to 100 Å.

The a-Si layer 150 forms a channel of a TFT and the first and second impurity silicon layers 160 and 160-1 lower the contact resistance between the upper conductive layer and the lower a-Si layer. The impurity nitrogen silicon layer 600 prevents the conductive layer from diffusing into the a-Si layer.

Figure 4A:
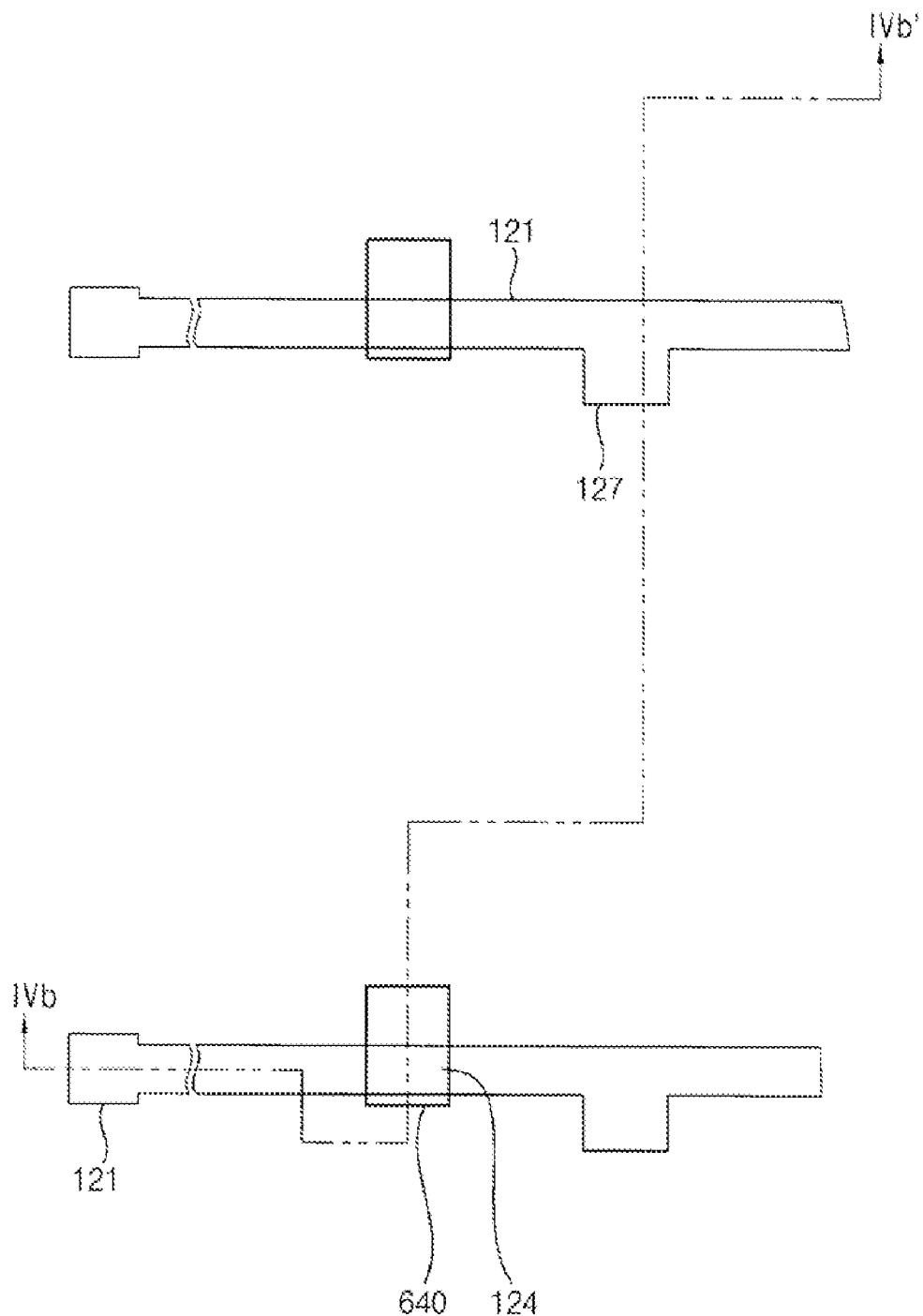
Figure 4B:
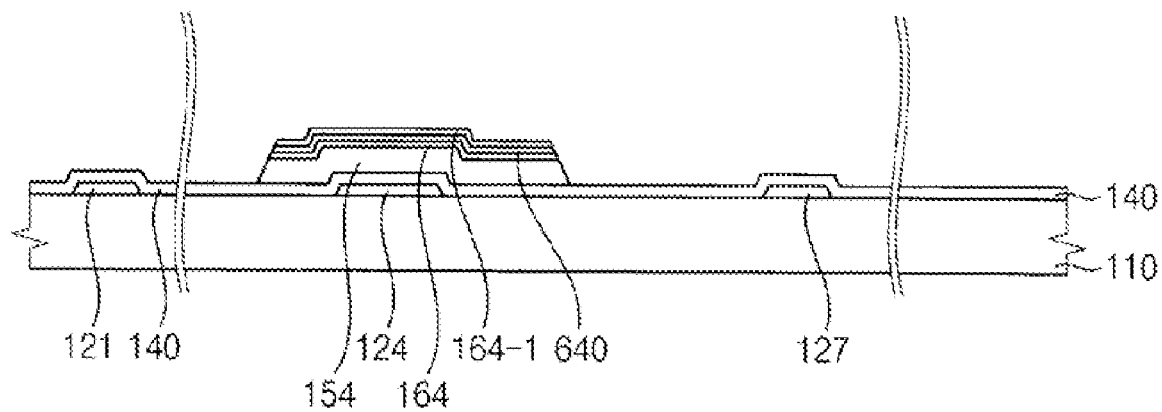
FIG. 4B is a cross sectional view of the TFT array panel shown in FIG. 4A taken along the line IVb-IVb'.

Referring to FIGS. 4A and 4B, the impurity nitrogen silicon layer 600, the first and second impurity silicon layers 160 and 160-1 and the a-Si layer are photo-etched to form a diffusion barrier pattern 640, a impurity semiconductor patterns 164 and 164-1, and a semiconductor layer 154.

Figure 5A:
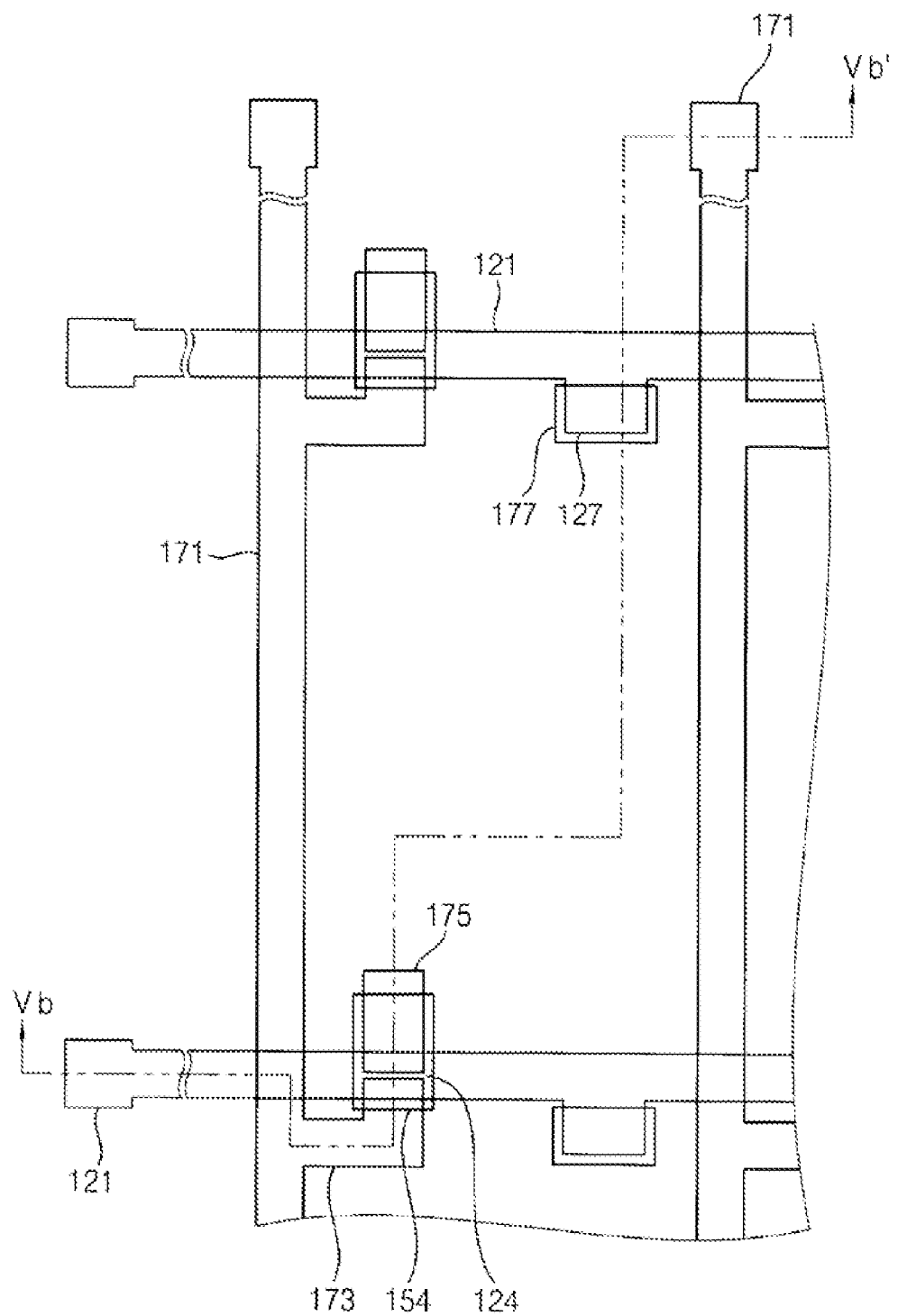
Figure 5B:
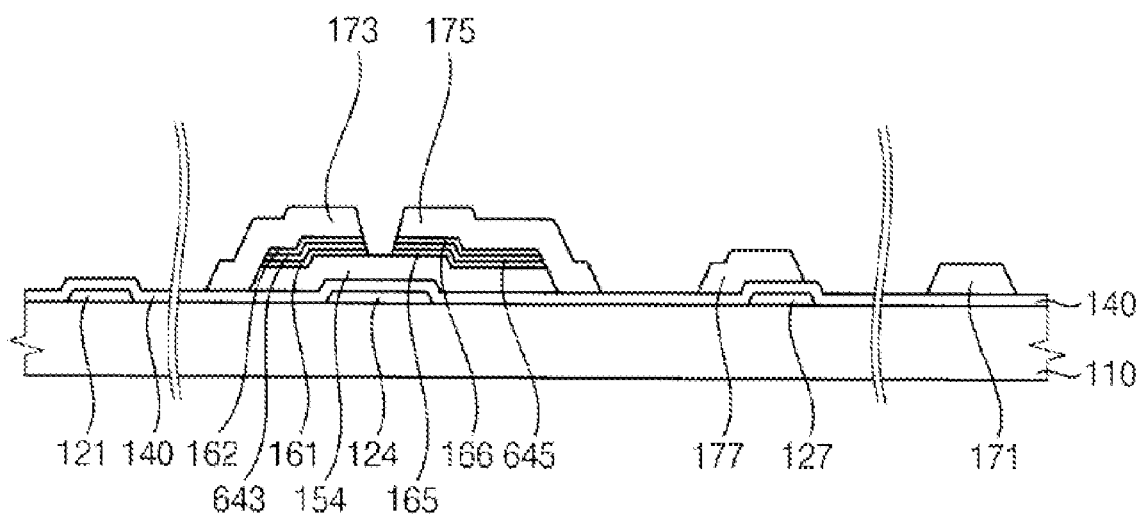
FIG. 5B is a cross sectional view of the TFT array panel shown in FIG. 4A taken along the line Vb-Vb'.

Next, as shown in FIGS. 5A and 5B, a data conductor layer is deposited on the impurity semiconductor patterns 164-1 by a method such as sputtering. The data conductor layer may include a Cu—Mn alloy.

A photoresist is formed on the data conductor layer and then the layer is patterned using an etch mask to form data line 171, source electrode 173, drain electrode 175, and storage conductor 177 (for example, by photo-etching).

Next, portions of the diffusion barrier pattern 640 and the impurity semiconductor patterns 164 and 164-1, which are not covered with the source electrode 173 and the drain electrode 175, are removed by etching to complete the diffusion barriers 643 and 645 and first and second ohmic contact layers 161 and 165 and 162 and 166 and to expose a portion of the intrinsic semiconductor layer 154.

By forming diffusion barrier layers 643 and 645, diffusion of metal into the semiconductor layer 154 may be prevented. Accordingly, current leakage is minimized.

Nitrogen of the diffusion barrier layers 643 and islands 645 serve as an n-type impurity by reducing contact resistance between the data line 171 and the semiconductor layer 154.

Figure 6A:
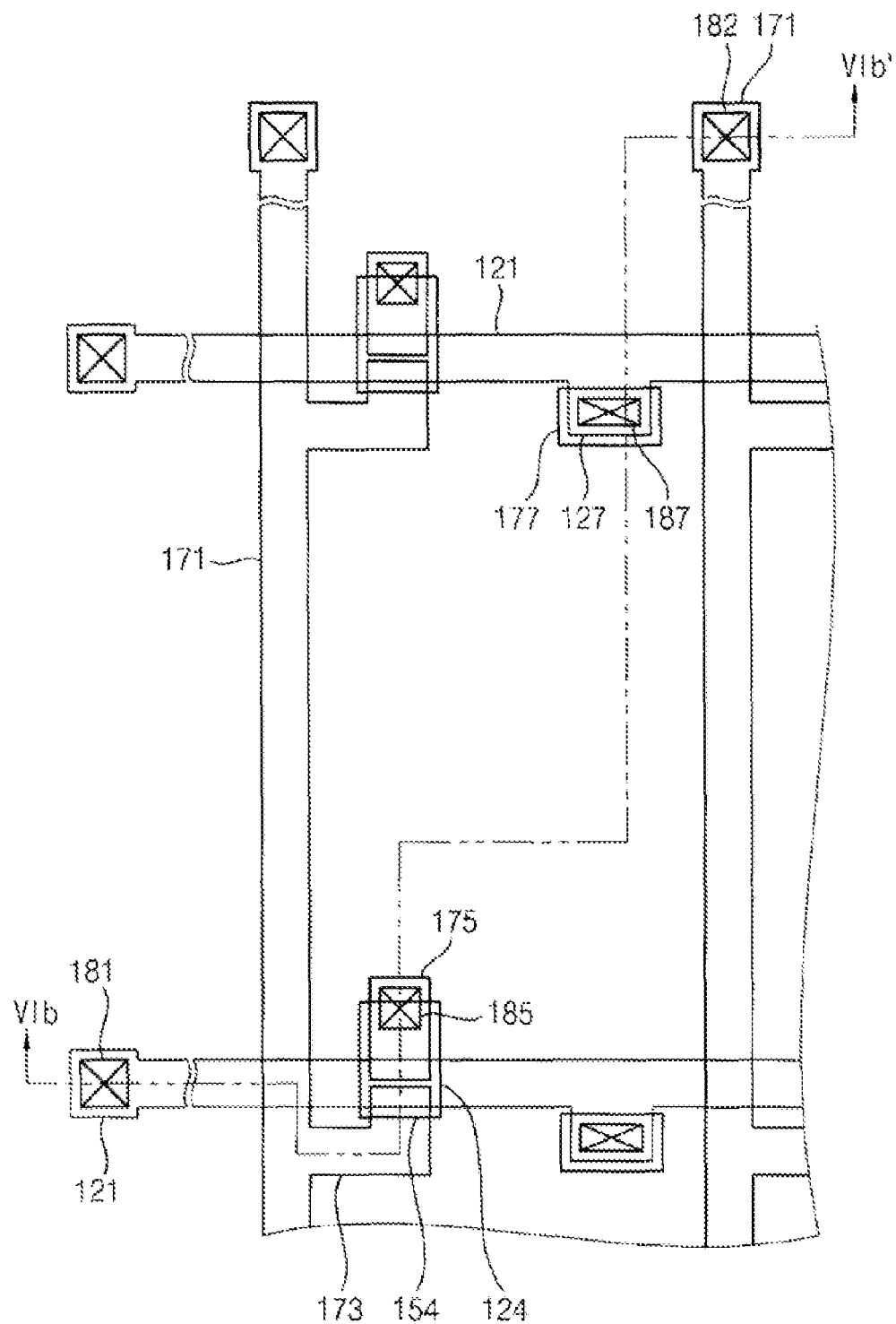
Figure 6B:
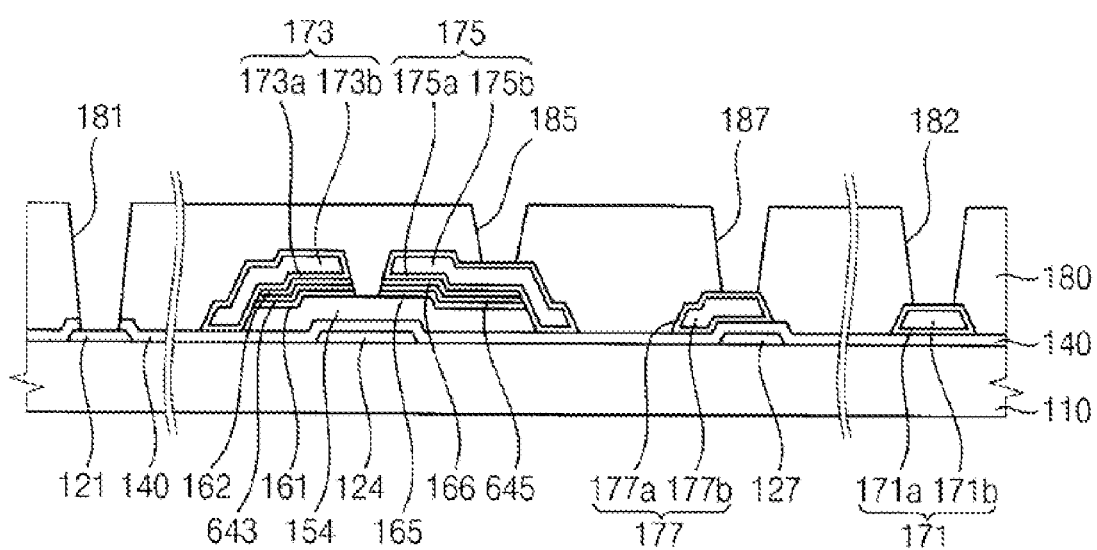
FIG. 6B is a cross sectional view of the TFT array panel shown in FIG. 6A taken along the line VIb-VIb'.

Referring to FIGS. 6A and 6B, a passivation layer 180 is deposited and covers the exposed portion of semiconductor layer 154. The passivation layer may be one of an inorganic material, an organic material having a photosensitivity, or a low dielectric insulation material such as a-Si:C:O or a-Si:O:F which is formed by chemical vapor deposition method. Mn can move toward a surface of the Cu—Mn alloy layer and the Mn may form a Mn oxide (171a, 173a, 175a and 177a) due to a heat temperature of the passivation formation process. The Mn oxide surrounds the inner (center) copper layer (171b, 173b, 175b and 177b).

The passivation layer 180 is then etched by photolithography to form contact holes 181, 182, 185 and 187. The gate insulating layer 140 and the passivation layer 180 are etched under an etch condition having substantially the same etch ratio for both the gate insulating layer 140 and the passivation layer 180.

When the passivation layer comprises a photosensitive material, the contact holes can be formed using photolithography.

As shown in FIGS. 1 and 2, a pixel electrode 190 and contact assistants 81 and 82 are formed by sputtering and photo-etching an IZO layer or an ITO layer.

A heat treatment may be applied to the substrate having the pixel electrode. By this heat treatment the Mn can move to the surface of the Cu—Mn alloy layer and the Mn can form a Mn oxide.

Figure 7:
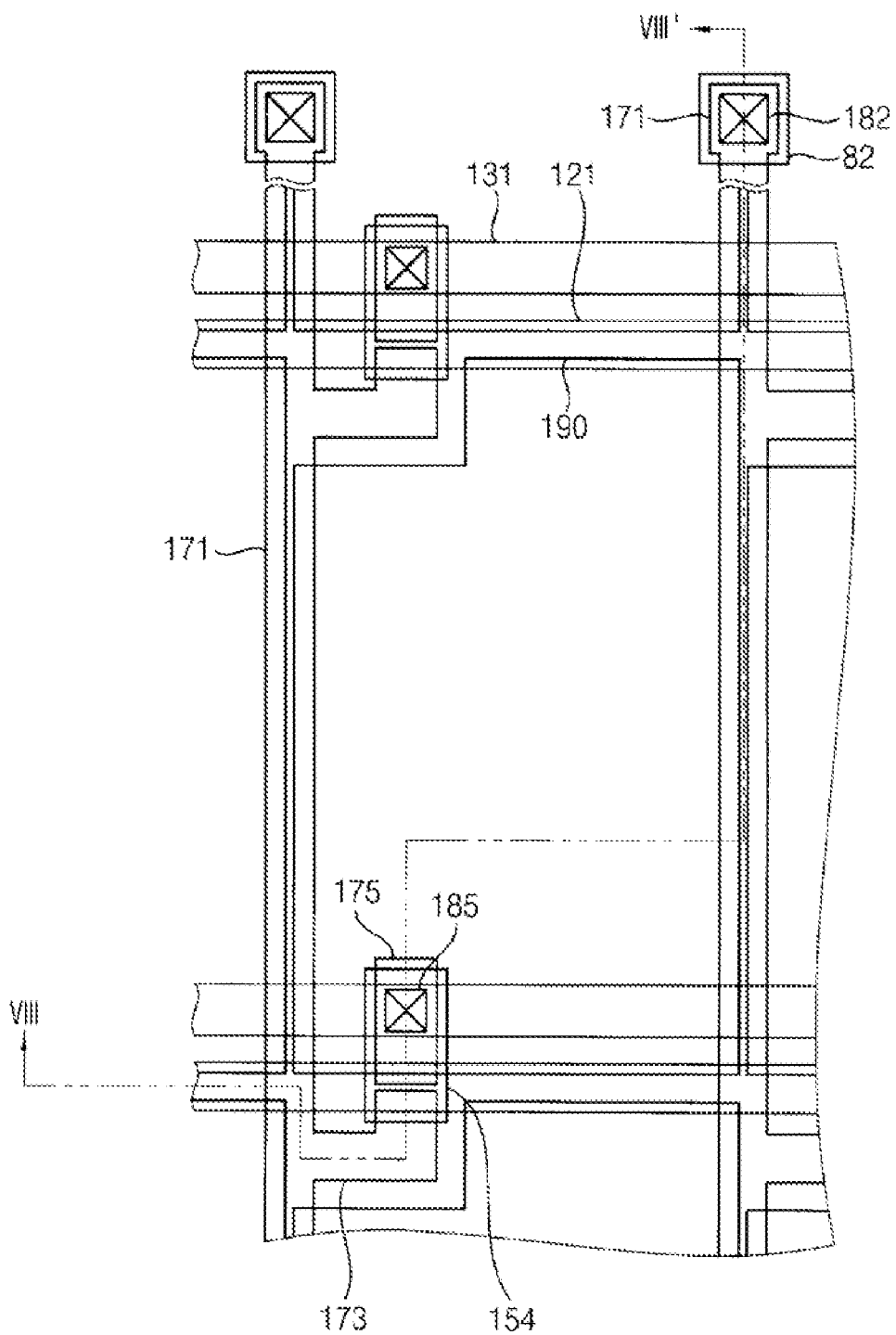
Figure 8:
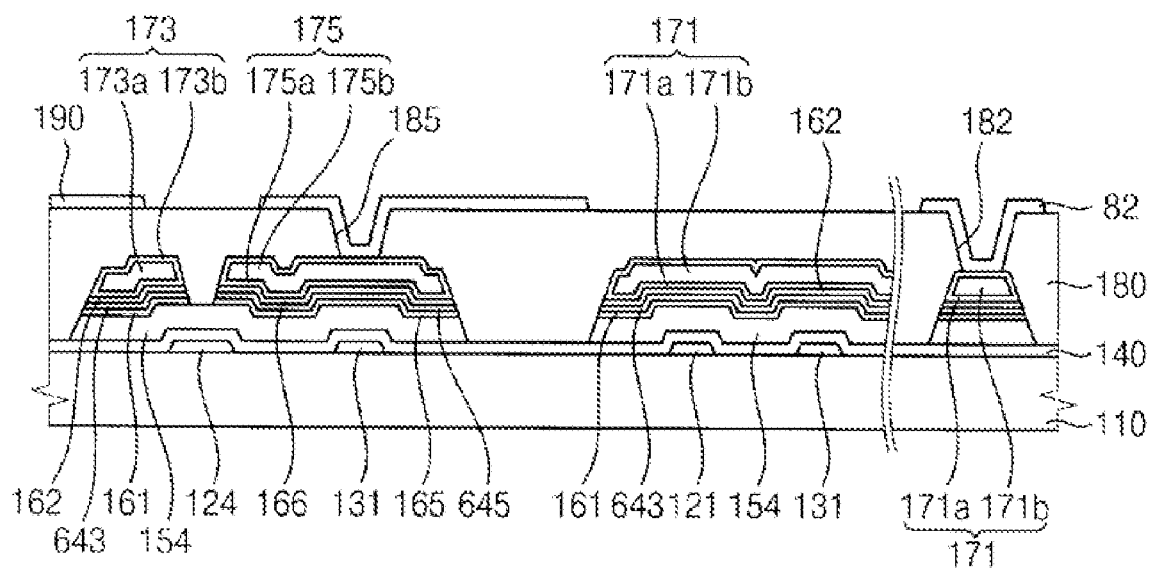
FIG. 8 is a cross sectional view of the TFT array panel shown in FIG. 7 taken along the line VIII-VIII'.

FIG. 7 is a layout view of a TFT array panel for an LCD according to an exemplary embodiment of the present invention. FIG. 8 is a cross sectional view of the TFT array panel shown in FIG. 7 taken along the line VIII-VIII'.

The layer structure of FIG. 7 may be similar to that of the TFT array panel shown in FIGS. 1 and 2.

Referring to FIG. 7, the TFT array panel according to an exemplary embodiment of the present invention includes a storage electrode line 131 which are separated from the gate lines 121 and are overlapped by the drain electrode 175 to form a storage capacitor. The storage electrode line 131 is formed at the same layer as the gate line 121.

The storage capacitor is implemented by overlapping the storage line 131 with the pixel electrode 190. The storage electrode line 131 is supplied with a predetermined voltage such as the common voltage. The storage electrode line 131 may be omitted if the storage capacitance generated by the overlapping of the gate line 121 and the pixel electrode 190 is sufficient. The storage electrode line 131 may be formed along a boundary of the pixel to increase an aperture ratio.

Referring to FIG. 8, a gate line 121 having a gate electrode 124 is formed on an insulating substrate 110. A gate insulating layer 140, a semiconductor layer 154, and first ohmic contact layers 161 and 165 are sequentially formed on the gate line 121 and gate electrode 124. Diffusion barrier layers 643 and 645 are formed on the first ohmic contact layers 161 and 165. Second ohmic contact layers 162 and 166 are sequentially formed on the diffusion barrier layers 643 and 645.

A data line 171, source electrode 173 and a drain electrode 175 are formed on the second ohmic contact layers 162 and 166 and on the gate insulating layer 140. A passivation layer 180 is formed on the data line 171, the source electrode 173, and the drain electrode 175. The passivation layer 180 has contact holes 182 and 185. A pixel electrode 190 and contact assistants 81 and 82 are formed on the passivation layer 180.

The data line 171, the source electrode 173 and the drain electrode 175 have substantially the same planar pattern as the diffusion barrier layers 643 and 645 and the first and second ohmic contact layers 161, 162, 165 and 166. The semiconductor layer 154 has substantially the same planar pattern as the first ohmic contact layers 161 and 165, except for a portion between the source electrode 173 and the drain electrode 175. The portion is exposed and not covered by the source electrode 173 and the drain electrode 175, whereas in FIG. 7, the semiconductor layer 154, the first and second ohmic contact layers, and the diffusion barrier layers are disposed under the data line 171, the source electrode 173 and the drain electrode 175.

The data line 171 has an end portion exposed through the contact hole 182 for contact with an external driving circuit. The exposed end portion of the data line 171 is coupled with the contact assistant 82 through the contact hole 182. The gate line 121 may have such an end portion when the gate line 121 is coupled with external circuits.

A method of manufacturing the TFT array panel illustrated in FIGS. 7 and 8 is described in detail below with reference to FIGS. 9A to 13A, as well as FIGS. 7 and 8.

Figure 9A:
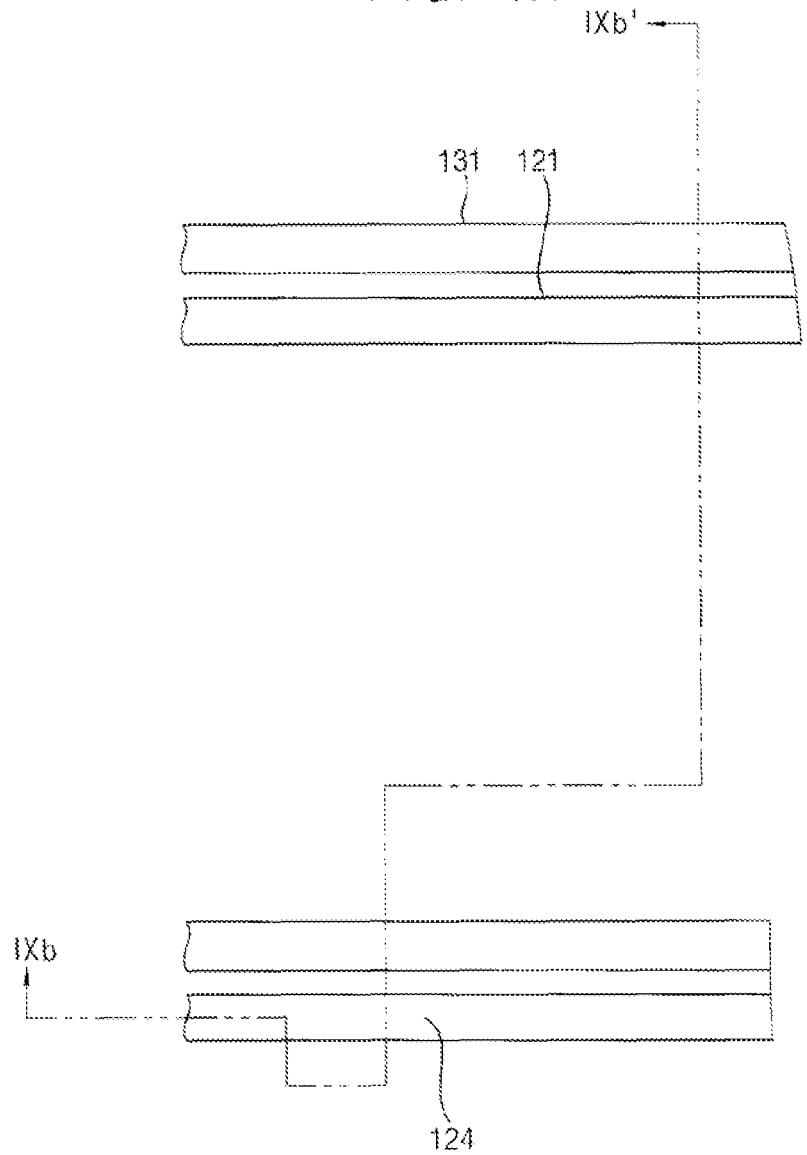
FIGS. 9A, 12A, and 13A are layout views of the TFT array panel shown in FIGS. 7 and 8 in intermediate steps of a manufacturing method according to an exemplary embodiment of the present invention.
Figure 9B:
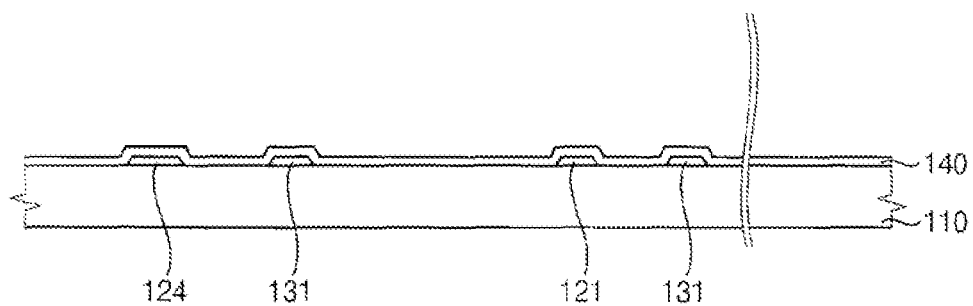
FIG. 9B is a cross sectional view of the TFT array panel shown in FIG. 9A taken along the line IXb-IXb'.
Figure 10:
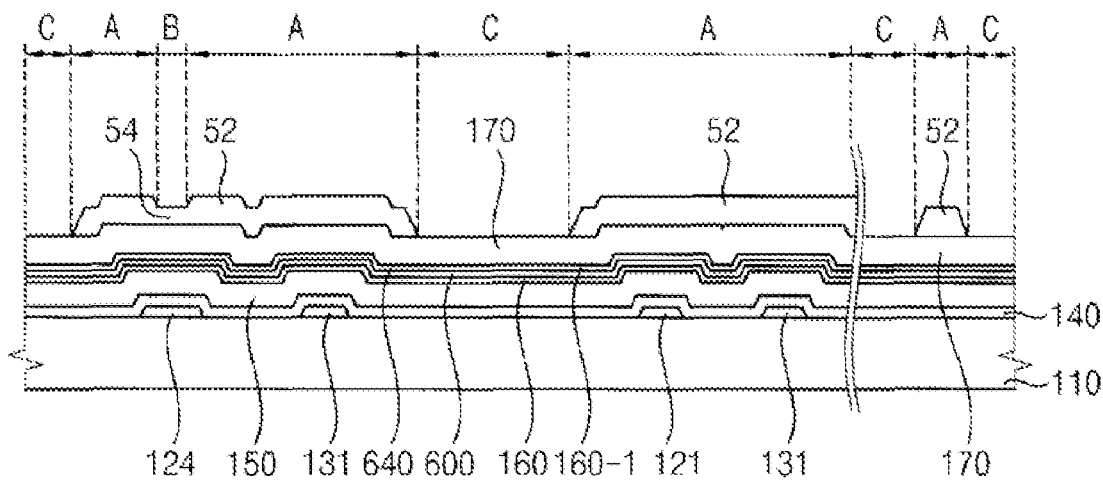
FIG. 10 is a cross sectional view of the TFT array panel in a step following the step shown in FIG. 9B.
Figure 11:
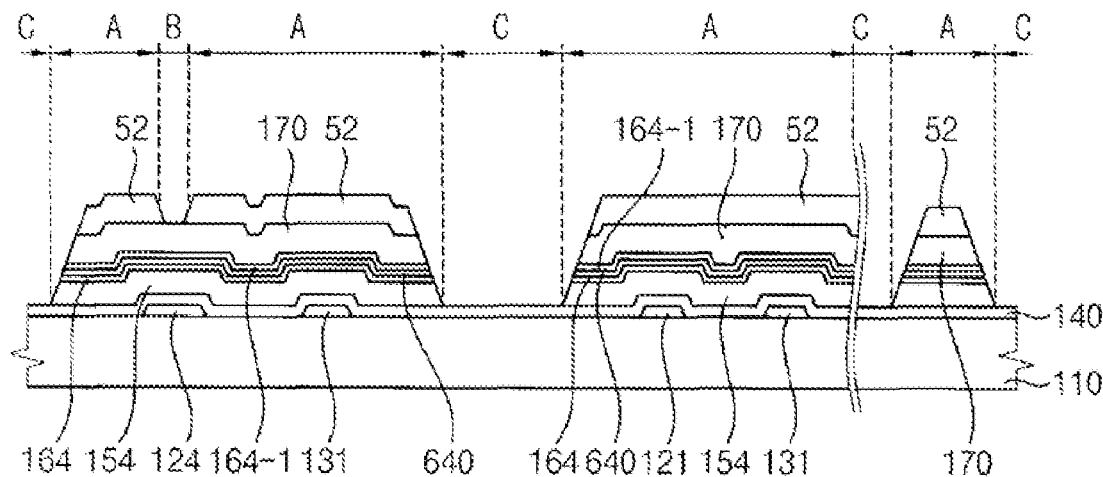
FIG. 11 is a cross sectional view of the TFT array panel in a step following the step shown in FIG. 10.
Figure 12A:
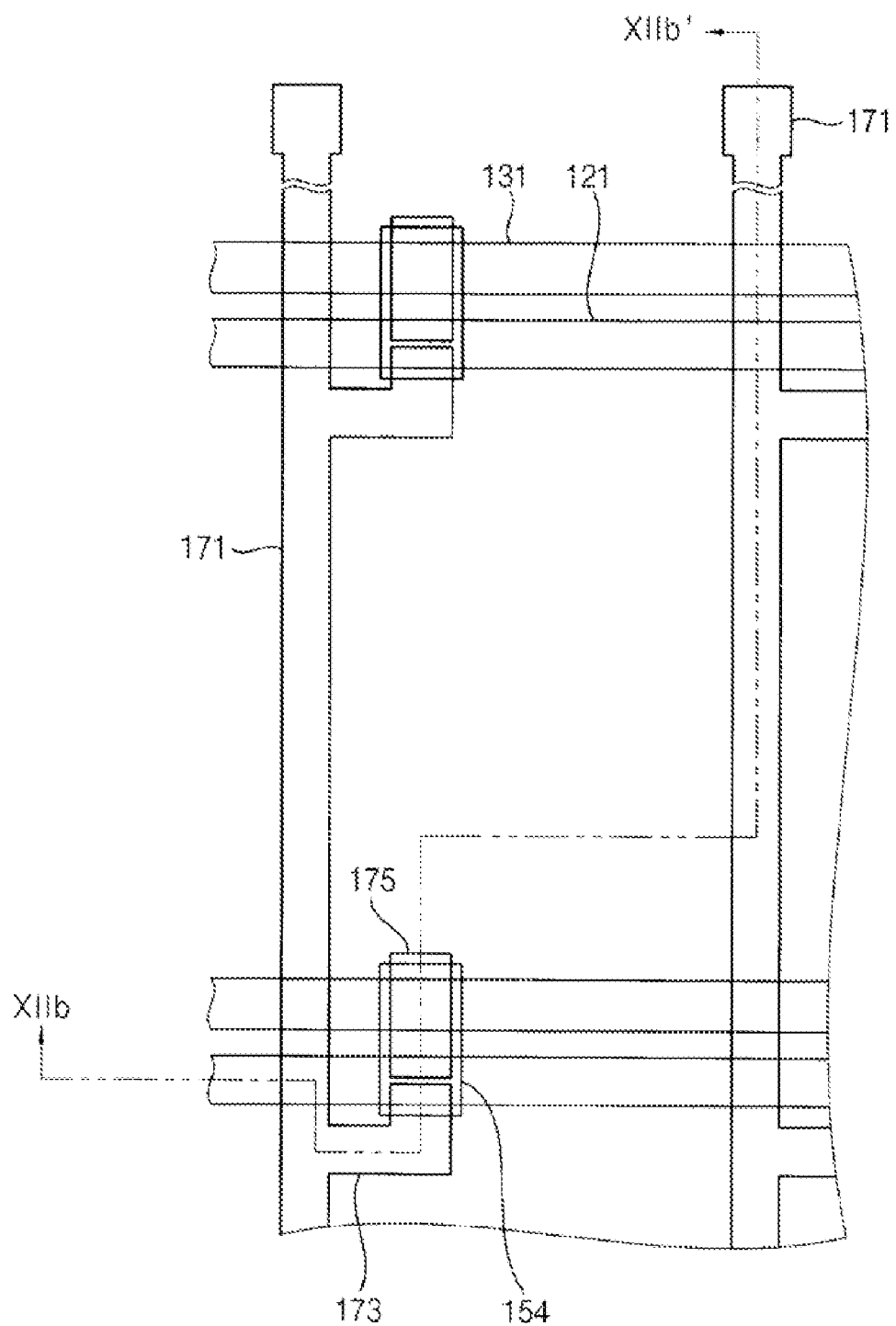
Figure 12B:
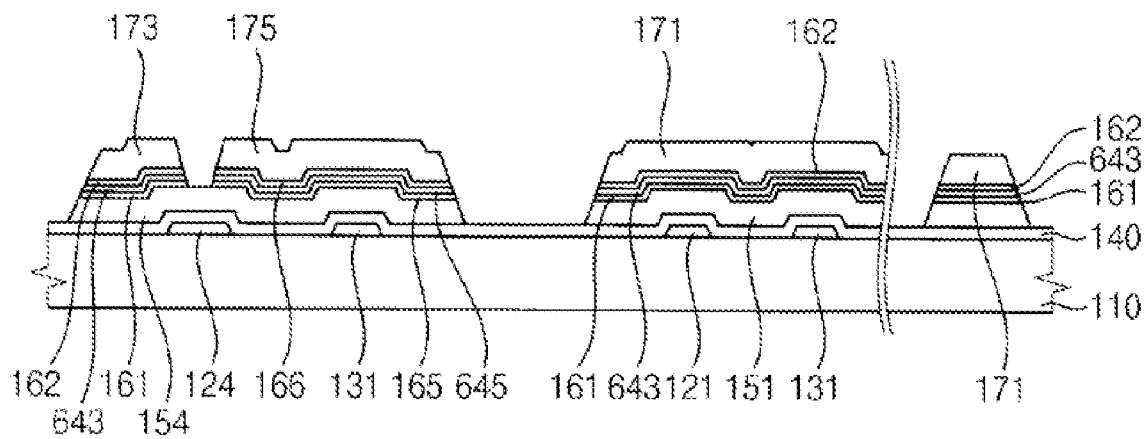
FIG. 12B is a cross sectional view of the TFT array panel shown in FIG. 12A taken along the line XIIb-XIIb'.
Figure 13A:
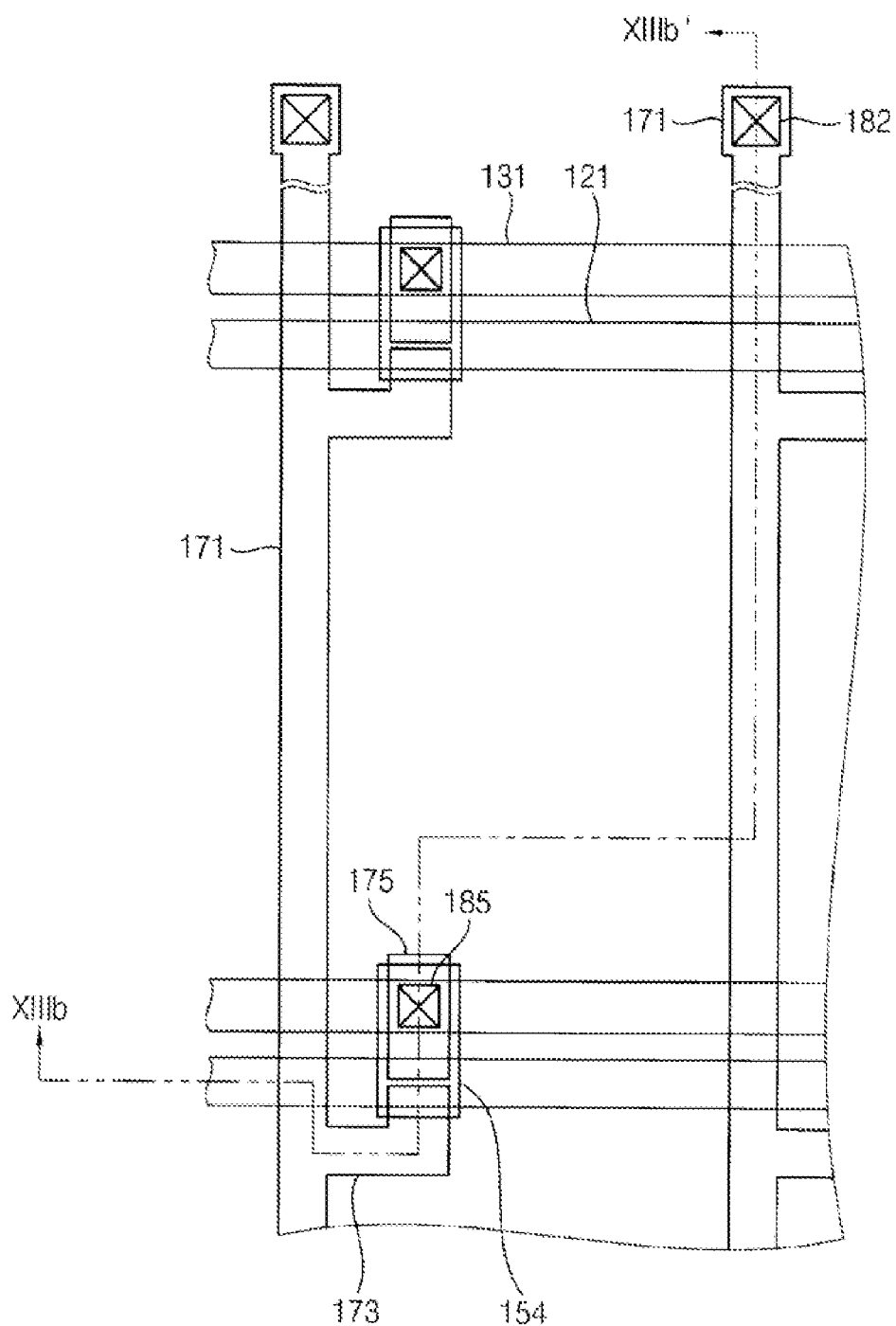
Figure 13B:
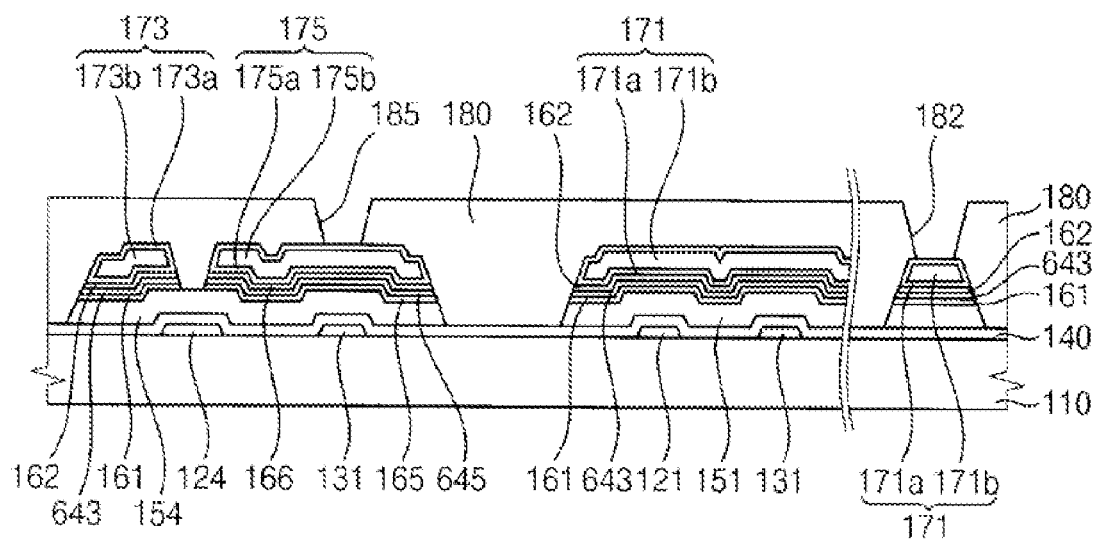
FIG. 13B is a cross sectional view of the TFT array panel shown in FIG. 13A taken along the line XIIIb-XIIIb'.

FIGS. 9A, 12A, and 13A are layout views of the TFT array panel shown in FIGS. 7 and 8 in intermediate steps of a manufacturing method according to an exemplary embodiment of the present invention. FIG. 9B is a cross sectional view of the TFT array panel shown in FIG. 9A taken along the line IXb-IXb'. FIG. 10 is a cross sectional view of the TFT array panel in a step following the step shown in FIG. 9B. FIG. 11 is a cross sectional view of the TFT array panel in a step following the step shown in FIG. 10. FIG. 12B is a cross sectional view of the TFT array panel shown in FIG. 12A taken along the line XIIb-XIIb'. FIG. 13B is a cross sectional view of the TFT array panel shown in FIG. 13A taken along the line XIIIb-XIIIb'.

As shown in FIGS. 9A and 9B, a metal layer is formed on an insulating substrate 110 by a method such as, for example, sputtering, and is photo-etched to form a gate line 121 having a gate electrode 124 and a storage line 131. The metal layer may be formed with the same material and through the same method as described above.

As shown in FIG. 10, a gate insulating layer 140 and a-Si layer 150, a first impurity silicon layer 160, impurity nitrogen silicon layer 600, second impurity silicon layer 160-1 are sequentially deposited on the gate line 121. The a-Si layer 150 comprises intrinsic amorphous silicon. The first and second impurity silicon layers 160 and 160-1 comprise extrinsic amorphous silicon which is doped with conductive impurity ions. The impurity nitrogen silicon layer 600 comprises extrinsic amorphous silicon containing nitrogen.

The gate insulating layer 140 may comprise silicon nitride or silicon oxide with a thickness of about 2,000 Å to about 5,000 Å.

The four Si layers (a-Si layer 150, a first impurity silicon layer 160, impurity nitrogen silicon layer 600 and second impurity silicon layer 160-1) may be deposited in a chamber by an in-situ method. After forming the a-Si layer 150, the first impurity silicon layer 160 is formed by deposition while adding n-type impurities. Then, the impurity nitrogen layer 600 is formed by adding one or both of $NH_3$ and $N_2$ gas. The second impurity silicon layer 160-1 is formed in a manner similar to the way in which the first impurity silicon layer is formed.

The impurity nitrogen silicon layer 600 can be formed, for example, by an ion implantation method or nitrogen plasma treatment after forming the first impurity silicon layer 160. The impurity nitrogen silicon layer 600 can have a thickness between 10 Å to 100 Å.

A data conductor layer is deposited on the impurity semiconductor patterns 164-1 by a method such as, for example, sputtering. The data conductor layer may include a Cu—Mn alloy.

A photoresist film is coated on the data conductor layer 170. The photoresist film is exposed to light through an exposure mask (not shown) and is developed such that the developed photoresist has a position-dependent thickness as shown in FIG. 10. The developed photoresist includes a plurality of first to third portions. The first portion 54 is located on channel areas B and the second portions 52 are located on the data line areas A. No reference numeral is assigned to the third portions located on the remaining areas C since they have substantially zero thickness. Here, the thickness ratio of the first portion 54 to the second portions 52 is adjusted depending upon the process conditions in the subsequent process steps. The thickness of the first portion 54 may be equal to or less than half of the thickness of the second portions 52.

The position-dependent thickness of the photoresist may be obtained by several techniques, for example, by providing translucent areas on the exposure mask as well as transparent areas and light blocking opaque areas. The translucent areas may have a slit pattern, a lattice pattern, or include one or more thin film(s) with intermediate transmittance or intermediate thickness. When using a slit pattern, the width of the slits or the distance between the slits may be smaller than the resolution of a light exposure used for the photolithography. Another example is to use reflowable photoresist. For example, once a photoresist pattern comprising a reflowable material is formed by using a normal exposure mask with transparent areas and opaque areas, it is subjected to a reflow process to flow onto areas without the photoresist, thereby forming thin portions.

Next, the photoresist film 52 and 54 and the underlying layers are etched such that the data lines 171, drain electrodes 175, and the underlying layers are left on the data areas A, only the intrinsic semiconductor layer is left on the channel areas B, and the gate insulating layer 140 is exposed on the remaining areas C (In FIGS. 12A and 12B).

A method to form such a structure will now be described. First, the exposed portions of the data conductor layer 170, the first and second impurity silicon layers 160 and 160-1, the impurity nitrogen silicon layer 600 and the a-Si layer 150 on the areas C are removed. Next, the photoresist film 54 on the channel portion (B) is removed. Then, the data conductor layer 170, the first and second impurity silicon layers 160 and 160-1 and the impurity nitrogen silicon layer 600 on the area B are removed. Then, the photoresist film 52 on the area A is removed.

The structure may also be formed by first removing the data conductor layer 170 on the area C. Then, the photoresist film on the channel area B is removed. Next, the first and second impurity silicon layer 160 and 160-1, the impurity nitrogen silicon layer 600 and the a-Si layer on the area C are removed. Then, the data conductor layer 170 on the area B is removed. Next, the photoresist film 52 on the area A is removed. Thereafter, the first and second impurity silicon layer 160, 160-1 and the impurity nitrogen silicon layer 600 are removed.

The above two approaches for forming the structure are described below in additional detail. Referring to FIG. 11, an exposed portion of the data conductor layer 170 on the area C is removed. The source and drain electrode is not separated until now. Then, the exposed portions of the first and second impurity silicon layers 160 and 160-1, the impurity nitrogen silicon layer 600 and the a-Si layer 150 on the areas C as well as the photoresist pattern 54 on the area B are removed. The data conductor layer 170 on the B is exposed. The removing of the photoresist film 54 on the channel portion (B) is performed at substantially the same time as the etching of the exposed portions of the first and second impurity silicon layers 160 and 160-1, the impurity nitrogen silicon layer 600 and the a-Si layer 150 on the areas C. Alternatively, removal of the photoresist film 54 may be performed independently of the etching of the exposed portions of the first and second impurity silicon layers 160 and 160-1, the impurity nitrogen silicon layer 600 and the a-Si layer 150 on the areas C. A remainder of the photoresist film 54 may be removed by ashing. At this time, the exposed portions of the semiconductor 154 may be etched to have a reduced thickness and the second portion 52 of the photoresist film may also be partially removed. The semiconductor layer 154 is then completed.

Referring to FIGS. 12A and 12B, the data conductor layer 170, the first and second impurity silicon layers 164 and 164-1 and the impurity nitrogen silicon layer 640 on the area B are removed. Then, the photoresist film 52 on the area A is removed.

Accordingly, the source electrodes 173 and the drain electrodes 175 are separated from each other, and, simultaneously, the diffusion barrier layers 643 and 645 and the first and second ohmic contact layers 161, 162, 165 and 166 thereunder are completed.

The semiconductor layer, the first ohmic contact layer, the diffusion barrier layer, the second ohmic contact layer and the data line having the source and drain electrode are formed through a single photo exposure process.

Thereafter, as shown in FIGS. 13A and 13B, a passivation layer 180 is formed to cover the data line 171, the drain electrode 175, and the exposed portions of the semiconductor layer 154, which are not covered by the source electrode 173 and the drain electrode 175. The passivation layer 180 may comprise a photosensitive organic material having a good flatness characteristic, a dielectric insulating material having a low dielectric constant such as a-Si:C:O and a-Si:O:F formed by plasma enhanced chemical vapor deposition (PECVD), or an inorganic material such as silicon nitride and silicon oxide.

Mn can move toward a surface of the Cu—Mn alloy layer and the Mn may form a Mn oxide (171a, 173a, 175a and 177a) due to the high temperature of the passivation formation process. The Mn oxide surrounds the inner (center) copper layer (171b, 173b, 175b and 177b).

Next, the passivation layer 180 is photo-etched to form contact holes 185 and 182. When the passivation layer 180 comprises a photosensitive material, the contact holes 185 and 182 may be formed using photolithography.

Finally, as shown in FIGS. 7 and 8, a pixel electrode 190 and contact assistants 82 are formed by sputtering and photo-etching an IZO layer or an ITO layer. The pixel electrodes 190 and the contact assistants 82 are respectively connected to the drain electrodes 175 and an end of the data lines 171 through the contact holes 185 and 182.

The substrate having the pixel electrode may undergo a heat treatment. By this heat treatment the Mn can move to the surface of the Cu—Mn alloy layer and the Mn can form a Mn oxide.

Exemplary embodiments of the present invention may provide for a thin film transistor array panel having color filters.

Figure 14:
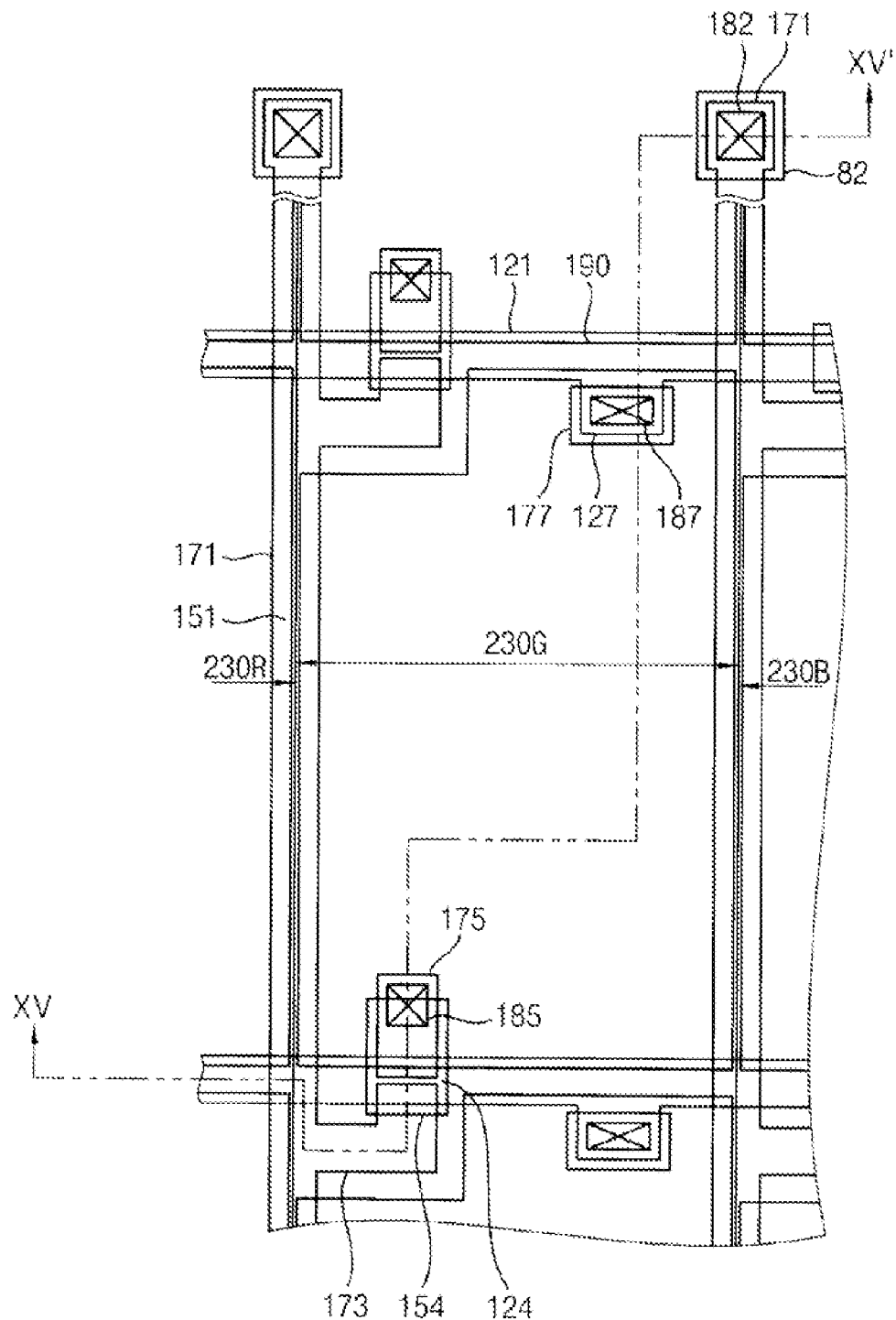
FIG. 14 is a layout view of a TFT array panel for an LCD according to an exemplary embodiment of the present invention.
Figure 15:
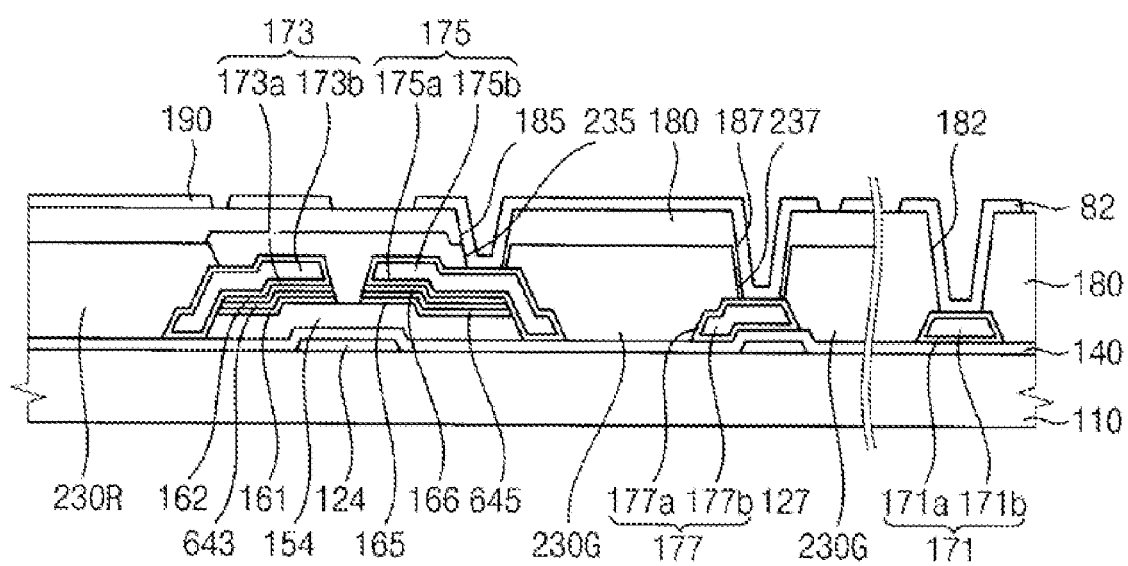
FIG. 15 is a sectional view of the TFT array panel shown in FIG. 14 taken along the line XV-XV'.

FIG. 14 is a layout view of a TFT array panel for an LCD according to an exemplary embodiment of the present invention. FIG. 15 is a sectional view of the TFT array panel shown in FIG. 14 taken along the line XV-XV'. The TFT array panel for an LCD according to an exemplary embodiment of the present invention may have a similar planar view to that described in detail above. However, color filters 230R, 230G, and 230B are formed on the passivation layer (not shown in FIG. 15, the passivation layer is under the color filter layer). The color filters 230R, 230G, and 230B are formed on the data line 171, the drain electrode 175 and the storage capacitor conductor 177. The color filters 230R, 230G, and 230B are formed along pixel columns which are partitioned by data lines 171. The red, green, and blue color filters 230R, 230G, and 230B are shown in turn.

The color filters 230R, 230G, and 230B are not formed on the end portions of the gate lines 121 and the data lines 171, which are coupled to external circuits. Two adjacent color filters 230R, 230G, and 230B overlap each other on the data lines 171. Accordingly, light leakage that may otherwise arise around a pixel area is prevented by the overlapping color filters 230R, 230G, and 230B. All of red, green, and blue color filters 230R, 230G, and 230B may be disposed on the data line 171 to overlap each other.

An interlayer insulating layer 180 is formed under the color filters 230R, 230G, and 230B to prevent pigments of the color filters 230R, 230G, and 230B from permeating into the pixel electrode 190.

As described above, when the color filters 230R, 230G, and 230B are formed on the thin film transistor array panel the opposite panel may have only a common electrode. Accordingly, the aperture ratio increases.

A method of manufacturing a TFT array panel according to an exemplary embodiment of the present invention is described in detail below with reference to FIGS. 16A to 17B as well as FIGS. 14 and 15.

Figure 16A:
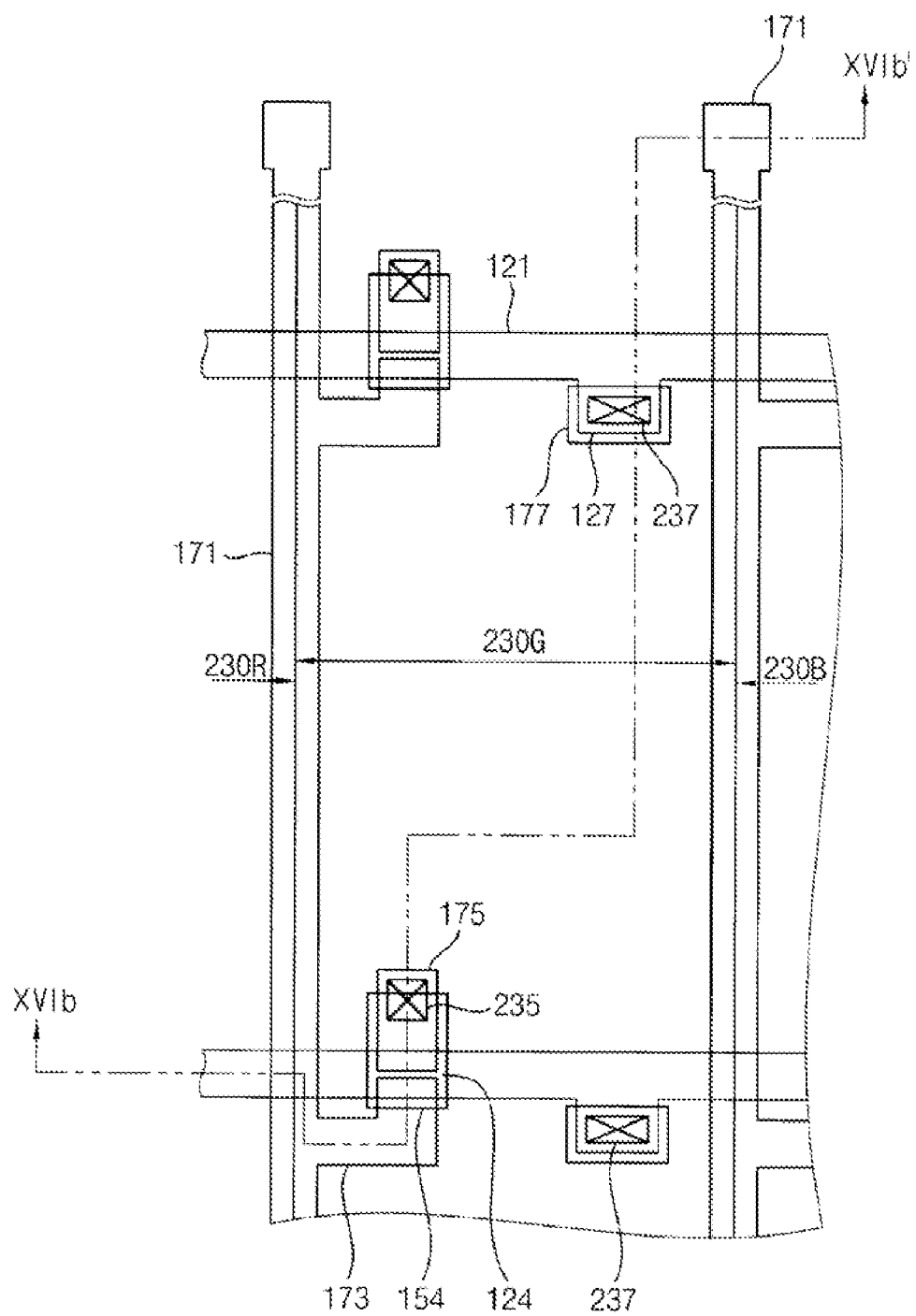
FIGS. 16A and 17A are layout views of the TFT array panel in intermediate steps of a manufacturing method according to an exemplary embodiment of the present invention.
Figure 16B:
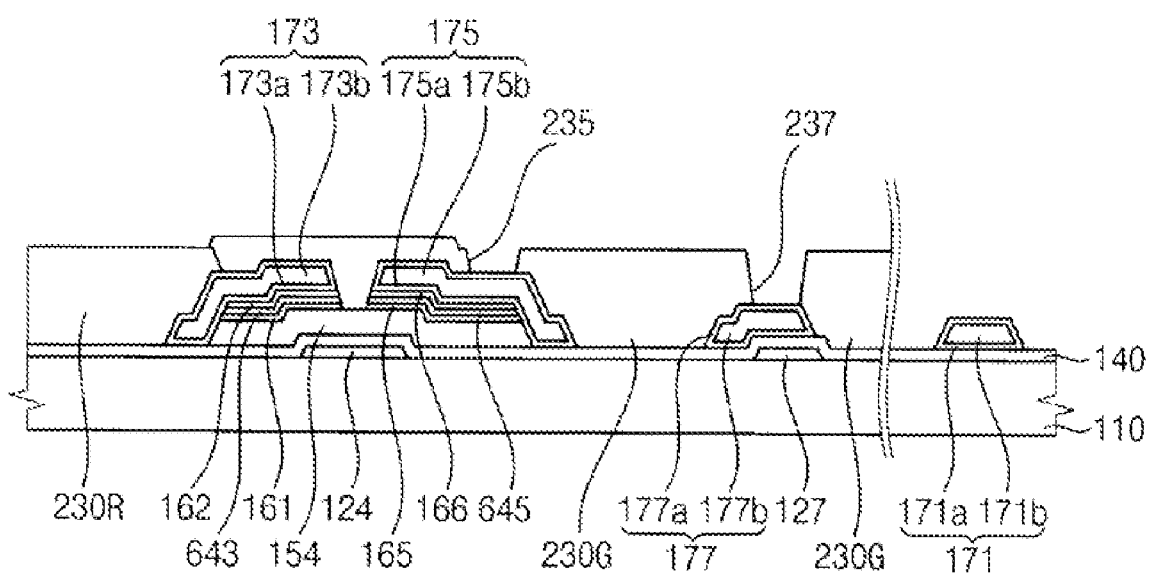
FIG. 16B is a cross sectional view of the TFT array panel shown in FIG. 16A taken along the line XVIb-XVIb'.
Figure 17A:
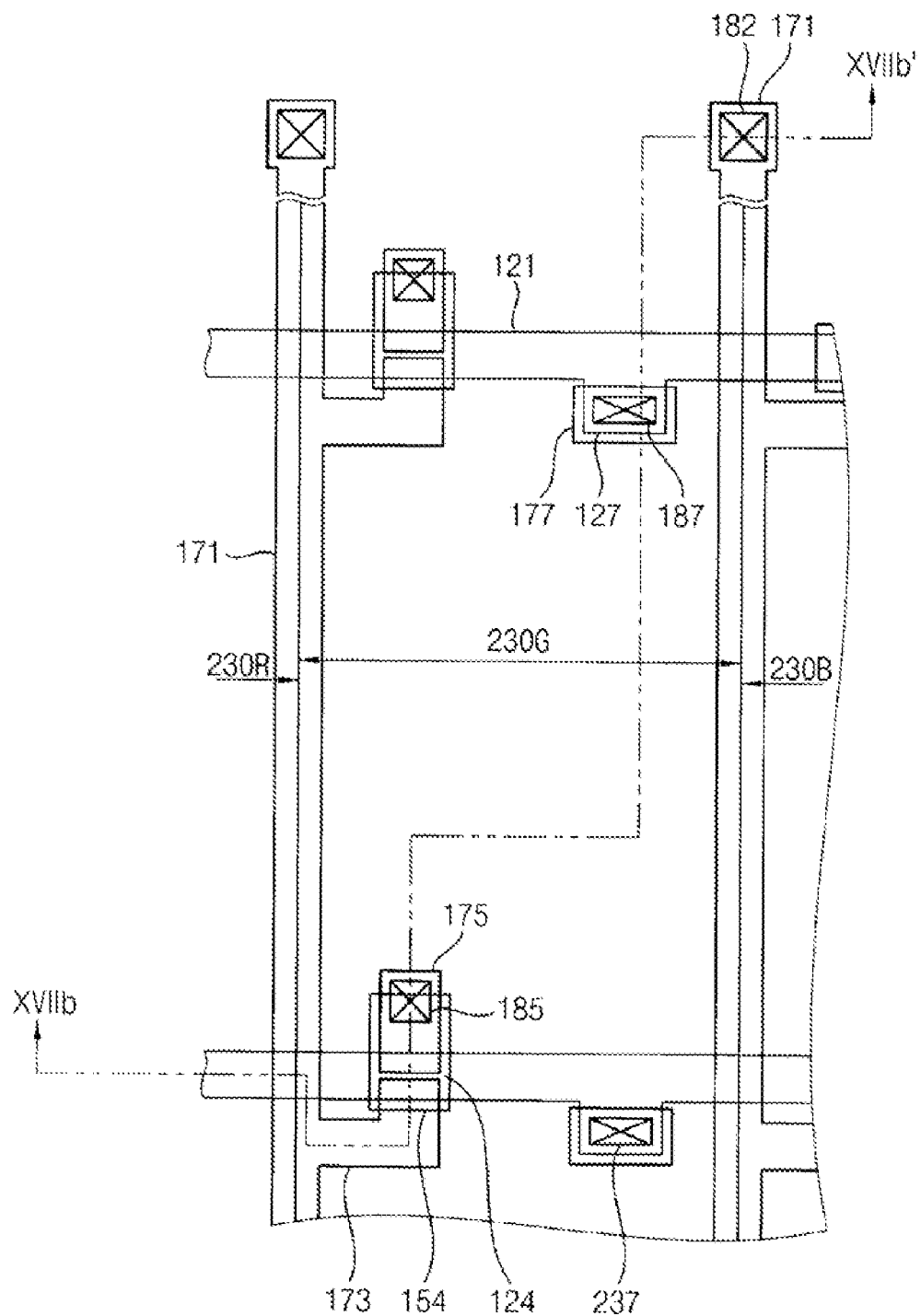
Figure 17B:
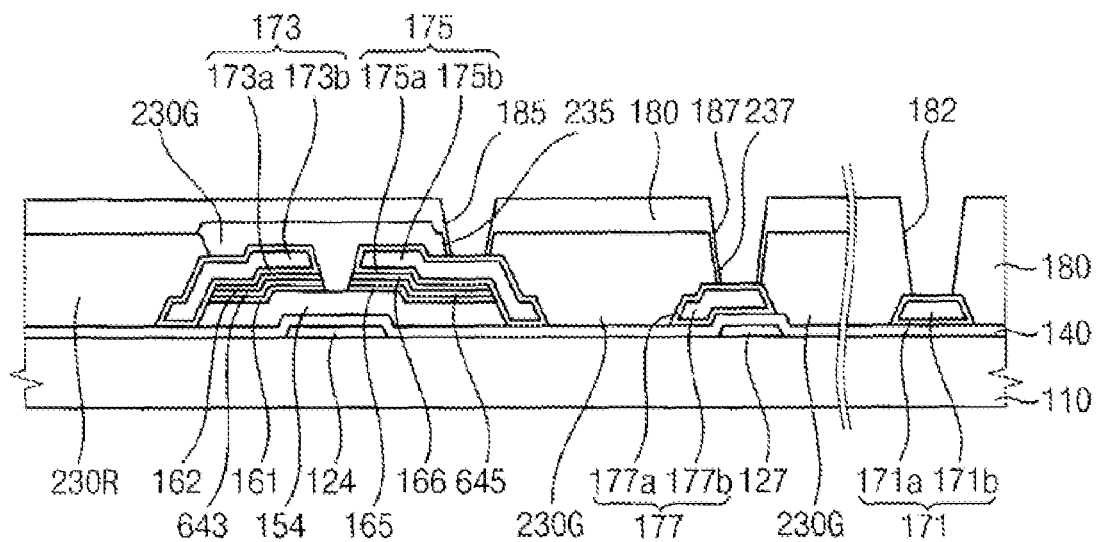
FIG. 17B is a sectional view of the TFT array panel shown in FIG. 17A taken along the line XVIIb-XVIIb'.

FIGS. 16A and 17A are layout views of the TFT array panel in intermediate steps of a manufacturing method according to an exemplary embodiment of the present invention. FIG. 16B is a cross sectional view of the TFT array panel shown in FIG. 16A taken along the line XVIb-XVIb'. FIG. 17B is a cross sectional view of the TFT array panel shown in FIG. 17A taken along the line XVIIb-XVIIv'.

Figure 3A:
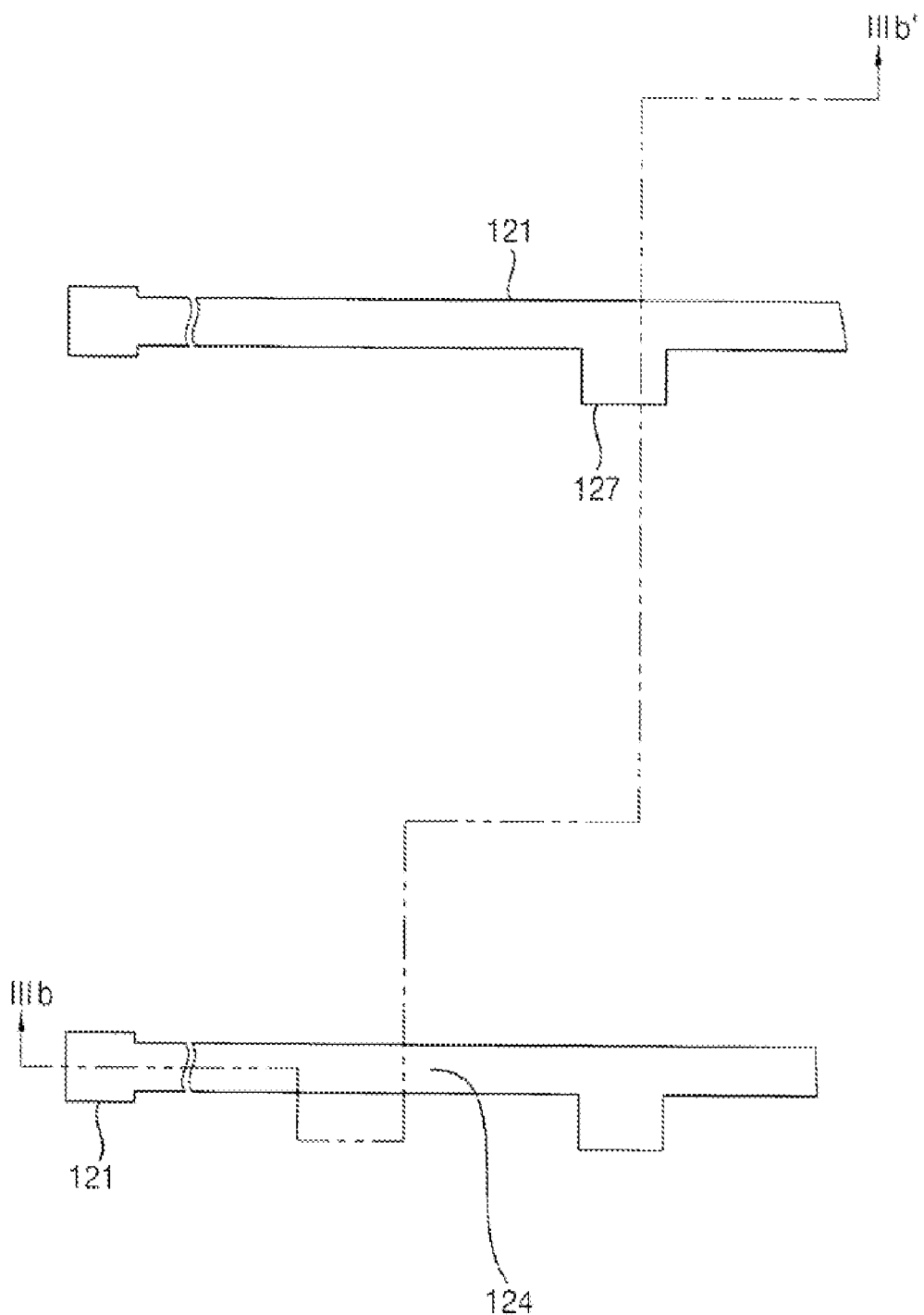
FIGS. 3A, 4A, 5A, 6A and 7 are layout views sequentially illustrating the intermediate steps of a method of manufacturing a TFT array panel for an LCD according to an exemplary embodiment of the present invention.
Figure 3B:
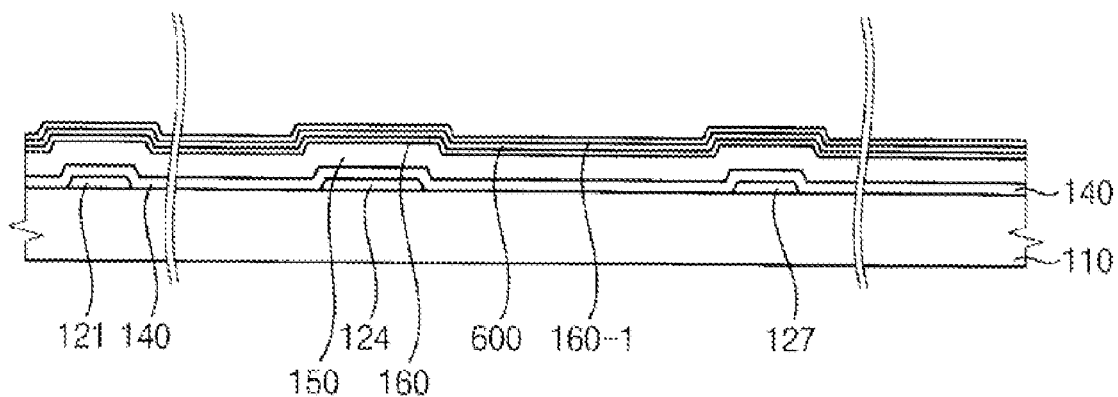
FIG. 3B is a cross sectional view of the TFT array panel shown in FIG. 3A taken along the line IIIb-IIIb'.

Referring to FIGS. 3A and 5B, a gate electrode 124, a gate insulating layer 140, a plurality of semiconductor layer 154, first and second ohmic contact layers 161, 162, 165 and 166, diffusion barrier layers 643 and 645, and a data line 171 and drain electrode 175 are sequentially formed on the substrate 110.

Next, in FIGS. 16A to 16B, organic photo-resist materials respectively containing pigments of red, green, and blue are coated and are patterned by a photo process to form color filters 230R, 230G, and 230B. Here, a passivation layer (not shown) comprising an organic material or an inorganic material may be formed in a single or multiple layered structures under the color filters. The passivation layer comprising an inorganic insulating material such as $SiN_x$ or $SiO_2$ is formed on the data line 171 and drain electrode 175 before forming the color filters 230R, 230G, and 230B. Openings 235 and 237 exposing the drain electrode 175 and the storage capacitor conductor 177 may be formed.

Referring to FIGS. 17A and 17B, an interlayer insulating layer 180 is formed by the coating of an organic insulating film having a low dielectric constant and a good flatness characteristic or by the PECVD of a low dielectric insulating material such as a-Si:C:O and a-Si:O:F having a dielectric constant.

Thereafter, the interlayer insulating layer 180 is photo-etched to form contact holes 182, 185, and 187. Here, the contact holes 185 and 187 exposing the drain electrodes 175 and the storage capacitor conductor 177 are formed in the openings 235 and 237 of the color filters 230R, 230G, and 230B.

Finally, as shown in FIGS. 14 and 15, a pixel electrode 190 and a contact assistant 82 are formed by sputtering and photo-etching an IZO layer or an ITO layer. The pixel electrode 190 is connected to the drain electrode 175 and the storage capacitor conductor 177 through the contact holes 185 and 187.

While exemplary embodiments of the present invention have been described in detail with reference to the figures, various modifications and substitutions can be made thereto without departing from the spirit and scope of the present invention.

What is claimed is:

1. A thin film transistor array panel comprising:
   an insulating substrate;
   a gate line formed on the insulating substrate and comprising a gate electrode;
   a gate insulating layer formed on the gate line;
   a semiconductor layer formed on the gate insulating layer and overlapping the gate electrode;
   a first ohmic contact layer formed on the semiconductor layer;
   a diffusion barrier layer comprising nitrogen formed on the first ohmic contact layer;
   a second ohmic contact layer formed on the diffusion barrier layer;
   a data line crossing the gate line and comprising a source electrode and a drain electrode on the diffusion barrier layer;
   a passivation layer on the data line; and
   a pixel electrode formed on the passivation layer and electrically connected to the drain electrode.

2. The thin film transistor array panel of claim 1, wherein the semiconductor layer has substantially the same planar pattern as the data line except for a portion of the semiconductor layer that is between the source and drain electrodes.

3. The thin film transistor array panel of claim 1, wherein the gate line comprise copper or a copper alloy.

4. The thin film transistor array panel of claim 1, further comprising red, green, and blue color filters under the pixel electrode on the insulating substrate.

5. The thin film transistor array panel of claim 1, wherein the data line comprise a Cu—Mn (copper-manganese) alloy.

6. The thin film transistor array panel of claim 5, wherein a surface of the data line comprises a Mn oxide.

7. A method for manufacturing a thin film transistor array panel, comprising:
   forming a gate line comprising a gate electrode on an insulating substrate;
   forming a gate insulating layer and an a-Si layer;
   forming a first ohmic contact layer doped with a conductive impurity, a diffusion barrier layer and a second ohmic contact layer;
   forming a data line comprising source and drain electrodes overlapping the second ohmic contact layer;
   forming a passivation layer on the data line; and
   forming a pixel electrode electrically connected to the drain electrode.

8. The method of claim 7, wherein the gate line comprises copper or a copper alloy.

9. The method of claim 7, wherein the data line comprises a Cu—Mn alloy.

10. The method of claim 7, wherein the diffusion barrier layer comprises nitrogen and a same material as the first ohmic contact layer.

11. The method of claim 7, wherein the diffusion barrier layer is formed through a plasma treatment.

12. The method of claim 7, wherein the a-Si layer, the first ohmic contact layer, the diffusion barrier layer, the second ohmic contact layer and the data line having the source and drain electrode are formed through a single photo exposure process.

13. The method of claim 7, wherein the diffusion barrier layer comprises nitrogen and a same material as the first ohmic contact layer.

14. A thin film transistor array panel comprising:
- a gate line comprising a gate electrode on an insulating substrate;
- a gate insulating layer;
- a semiconductor layer;
- a first ohmic contact layer doped with a conductive impurity, a diffusion barrier layer and a second ohmic contact layer;
- a data line comprising a source electrode and a drain electrode overlapping the second ohmic contact layer;
- a passivation layer on the data line; and
- a pixel electrode electrically connected to the drain electrode.

15. The transistor array panel of claim 14, wherein the semiconductor layer has substantially the same planar pattern as the data line except for a portion of the semiconductor layer that is between the source and drain electrodes.

16. The transistor array panel of claim 14, wherein the gate line comprise copper or a copper alloy.

17. The transistor array panel of claim 14, further comprising red, green, and blue color filters under the pixel electrode on the insulating substrate.

18. The transistor array panel of claim 14, wherein the data line comprise a Cu—Mn (copper-manganese) alloy.

19. The transistor array panel of claim 18, wherein a surface of the data line comprises a Mn oxide.

20. The transistor array panel of claim 14, wherein the diffusion barrier layer comprises nitrogen and a same material as the first ohmic contact layer.

* * * * *